United States Patent [19]
Iwamura et al.

[11] Patent Number: 5,903,482
[45] Date of Patent: May 11, 1999

[54] SAMPLING FREQUENCY CONVERTING SYSTEM AND A METHOD THEREOF

[75] Inventors: Hiroshi Iwamura; Kyoichi Terao, both of Saitama-ken, Japan

[73] Assignee: Pioneer Electronic Corp., Tokyo, Japan

[21] Appl. No.: 08/963,826

[22] Filed: Nov. 4, 1997

[30] Foreign Application Priority Data

Jun. 20, 1997 [JP] Japan ................................. 9-164758

[51] Int. Cl.⁶ ................................................ G06F 17/17
[52] U.S. Cl. ................................ 364/724.1; 341/61
[58] Field of Search .................. 364/724.1, 724.011; 341/61

[56] References Cited

U.S. PATENT DOCUMENTS

| | | | |
|---|---|---|---|
| 5,432,551 | 7/1995 | Sadjadian et al. | 364/724.1 |
| 5,481,568 | 1/1996 | Yada | 364/724.1 |
| 5,497,152 | 3/1996 | Wilson et al. | 364/724.1 |
| 5,621,404 | 4/1997 | Heiss et al. | 364/724.1 |

*Primary Examiner*—Tan V. Mai
*Attorney, Agent, or Firm*—Nikaido, Marmelstein, Murray & Oram LLP

[57] ABSTRACT

An over-sampling device is provided for double over-sampling the input signal and for outputting as a sampling signal. The sampling signal is filtered at one of conversion rates of 147/160, 160/147, and 1/1 by using a prototype filter, based on the first sampling frequency and the second sampling frequency, and a filtering signal is produced. The filtering signal is filtered by a low pass filter having a predetermined cutoff frequency band, and a low frequency signal is produced. A down-sampling device is provided for down-sampling the low frequency signal by one half.

17 Claims, 31 Drawing Sheets

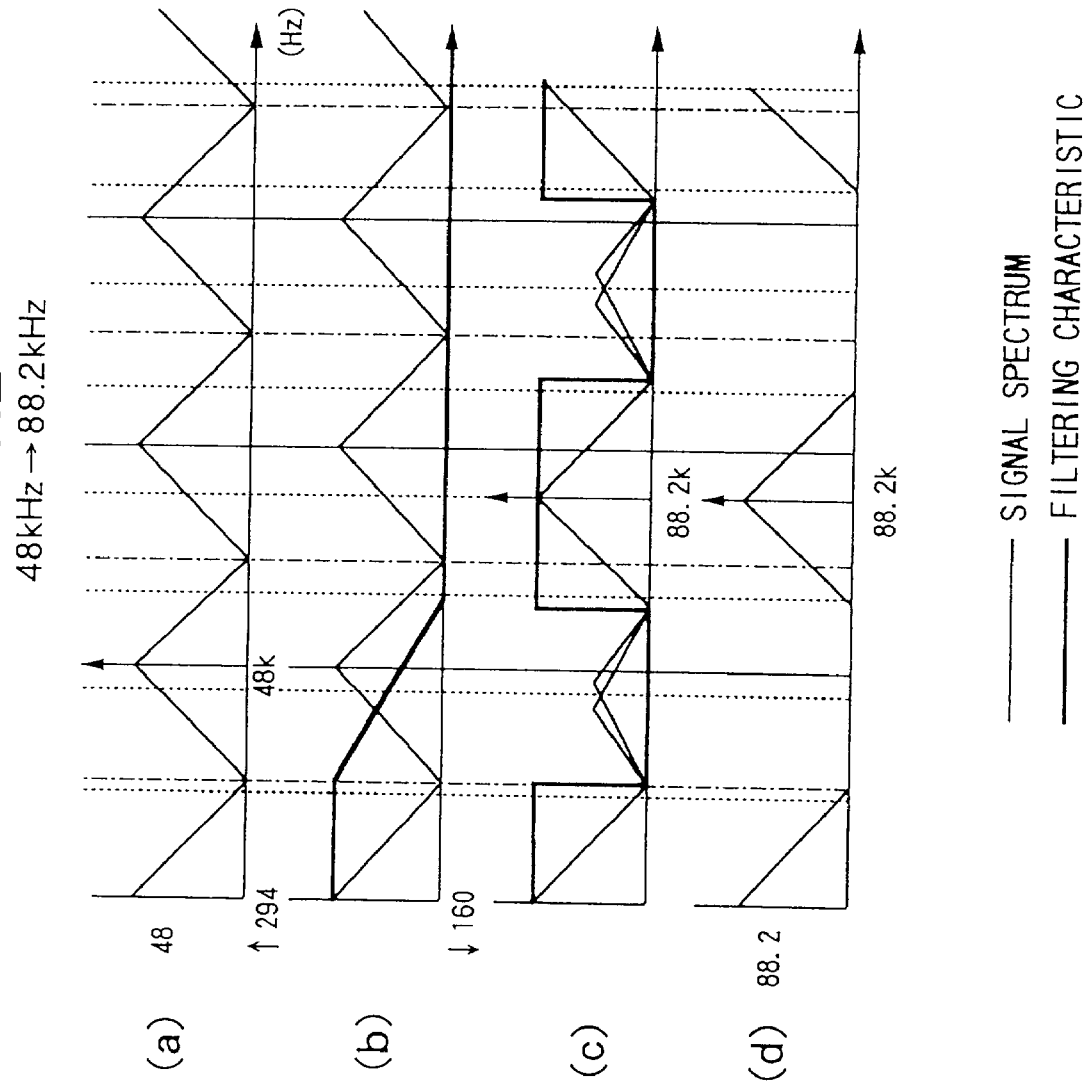

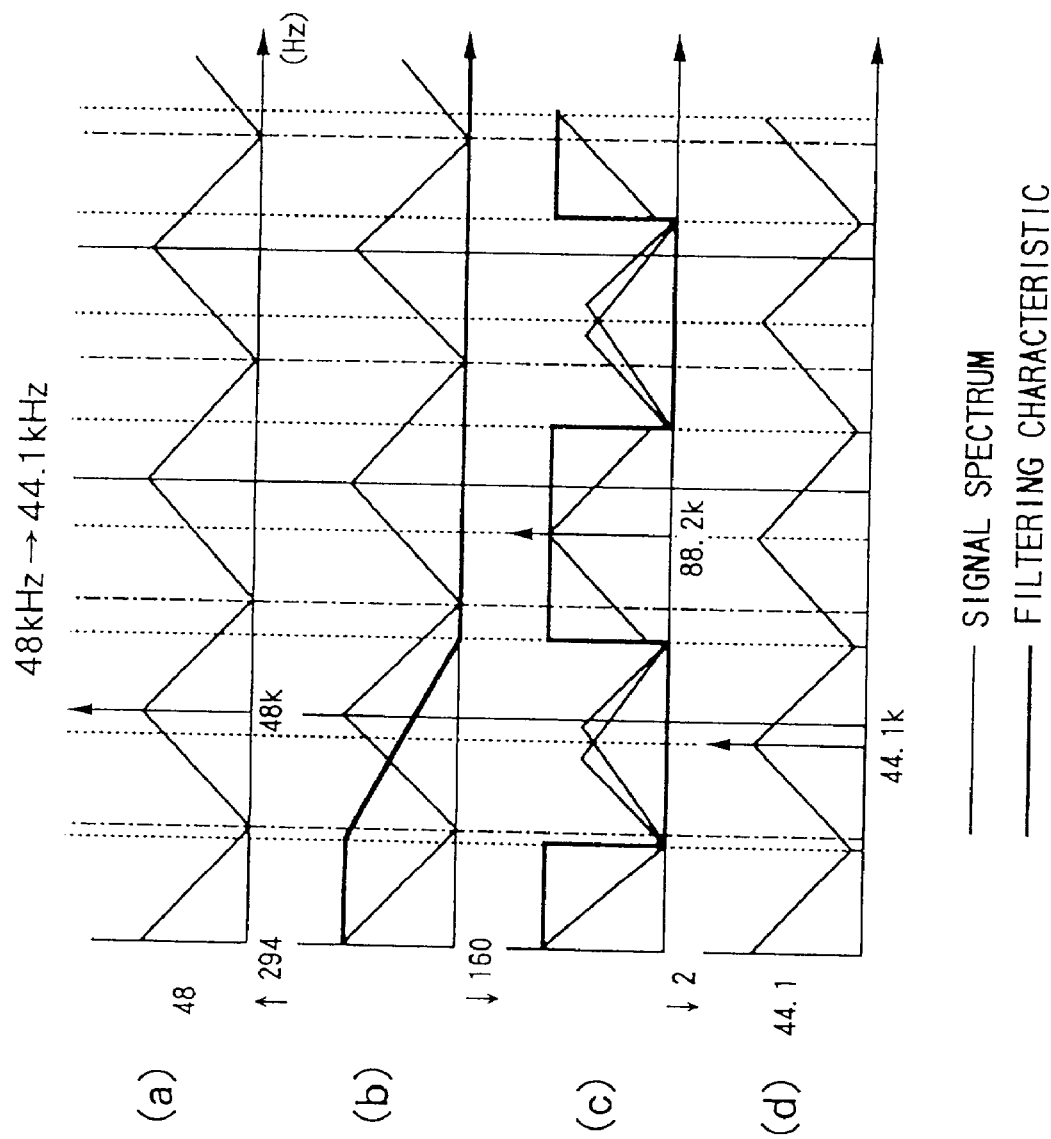

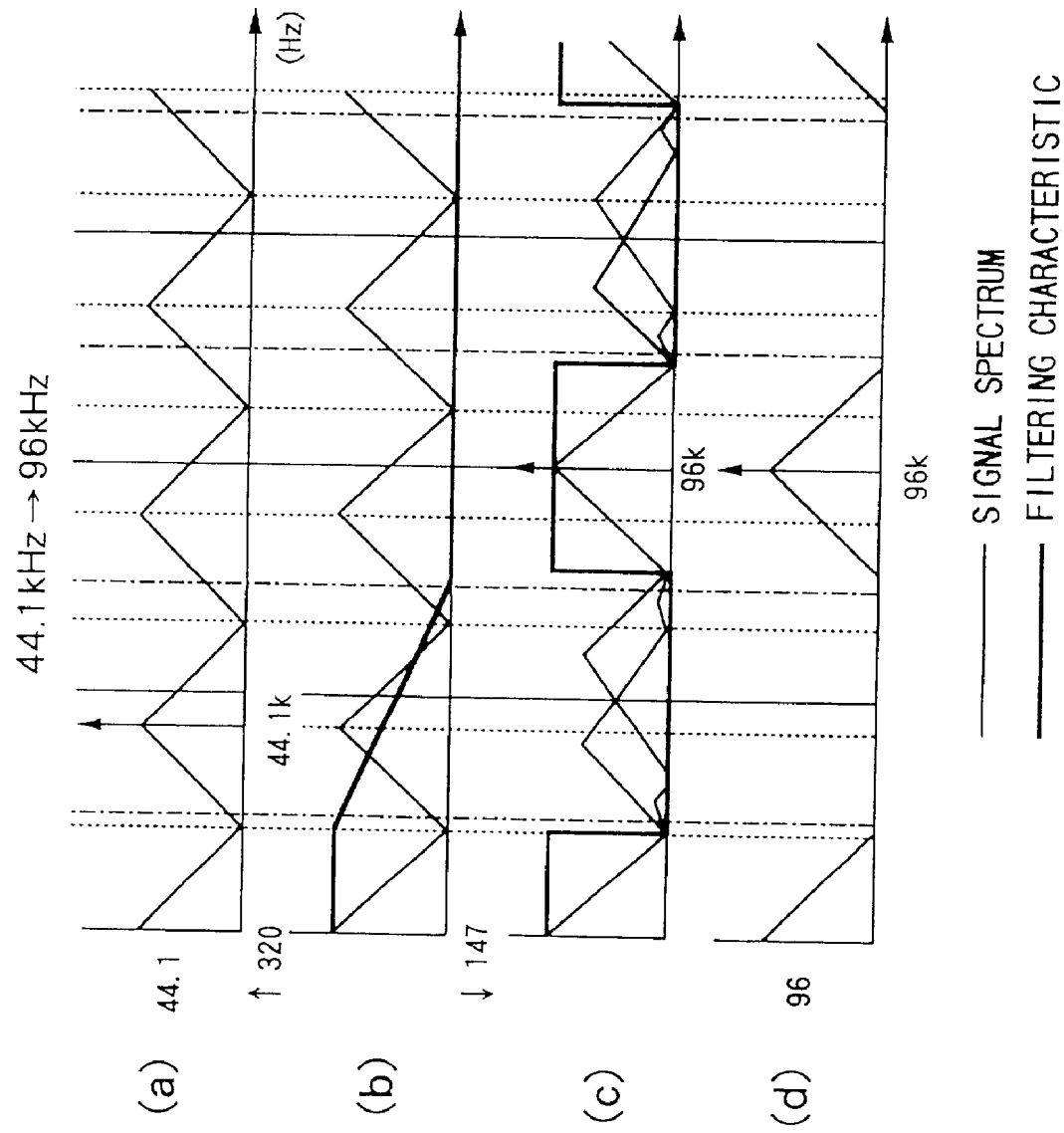

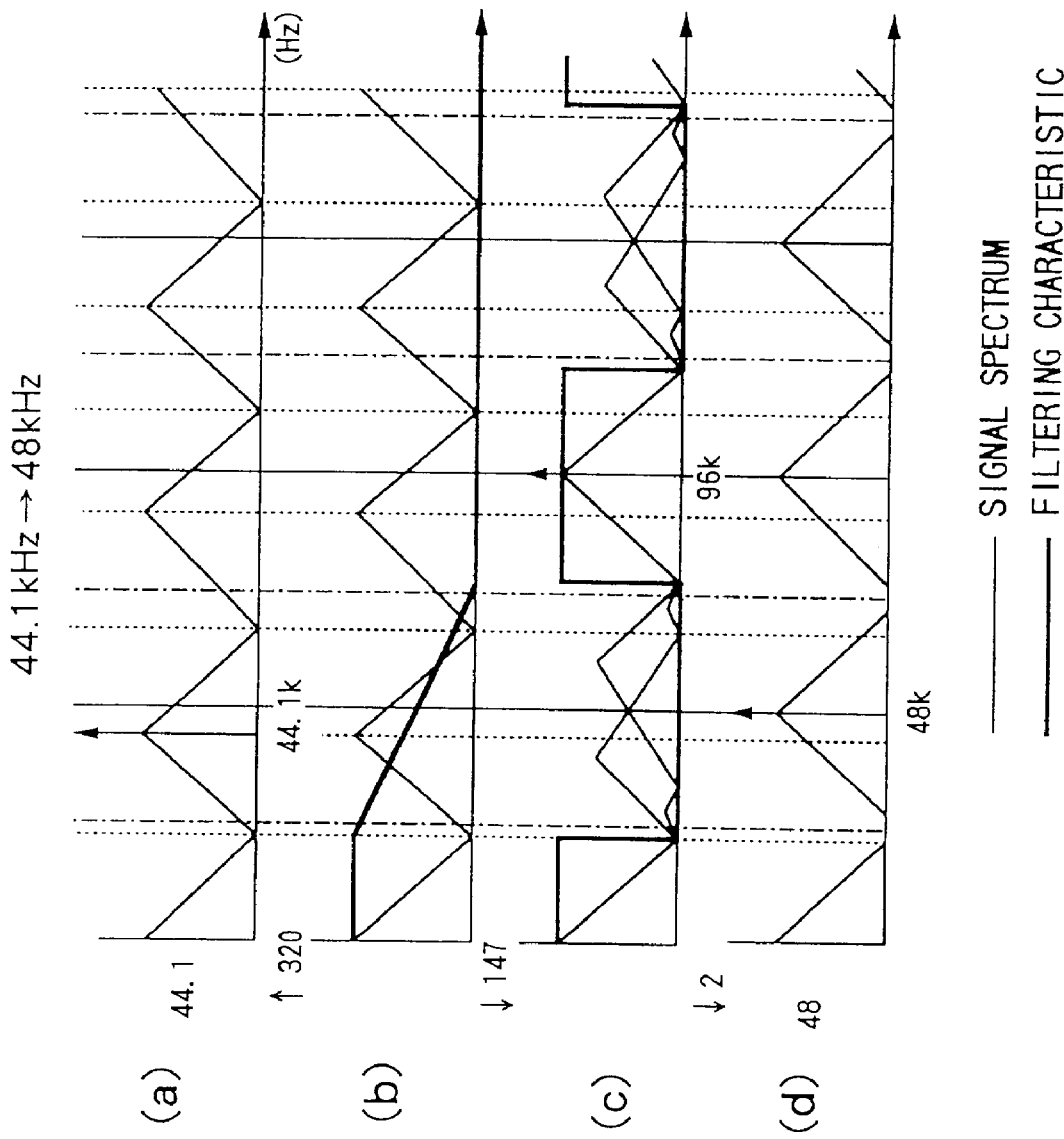

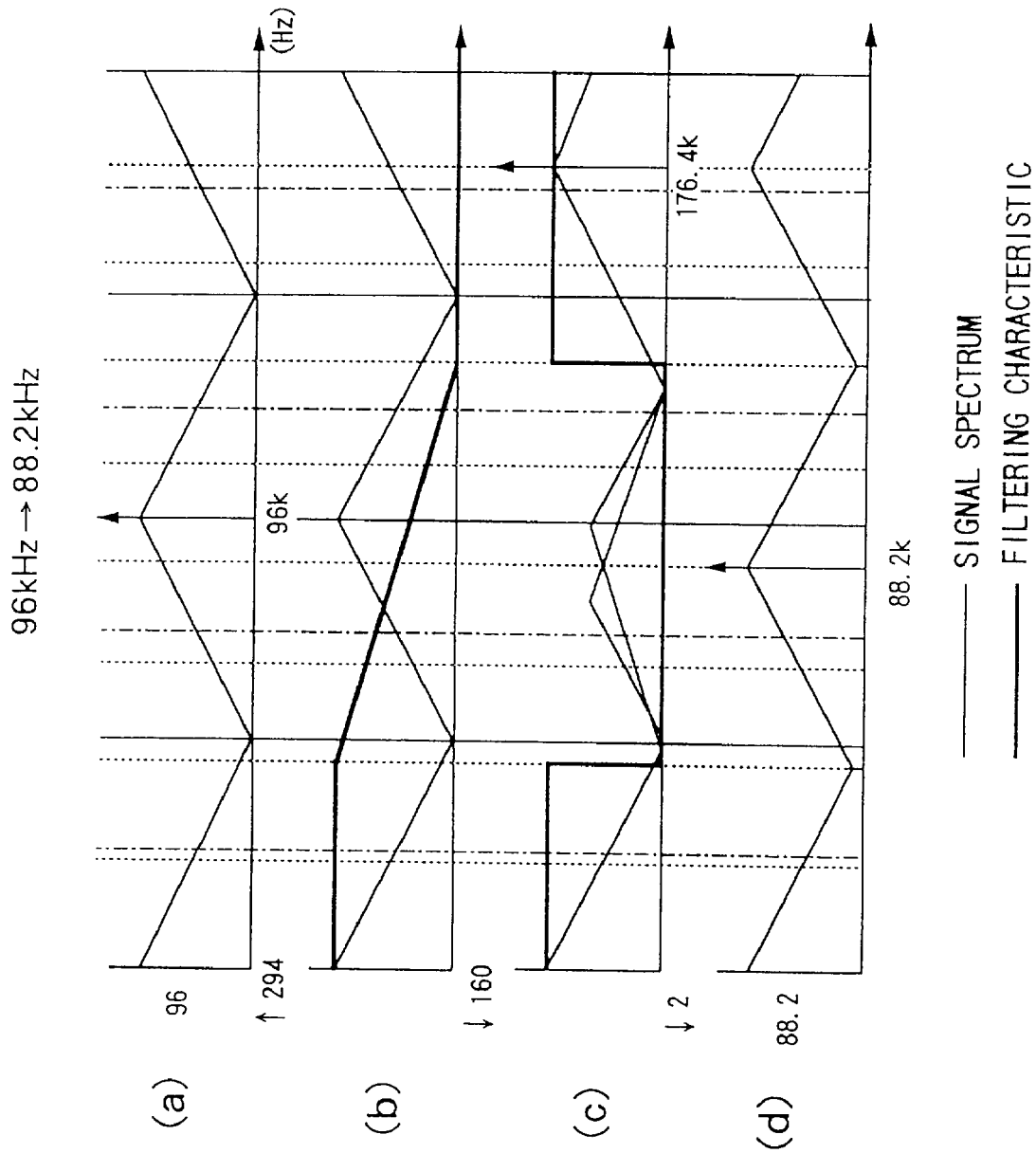

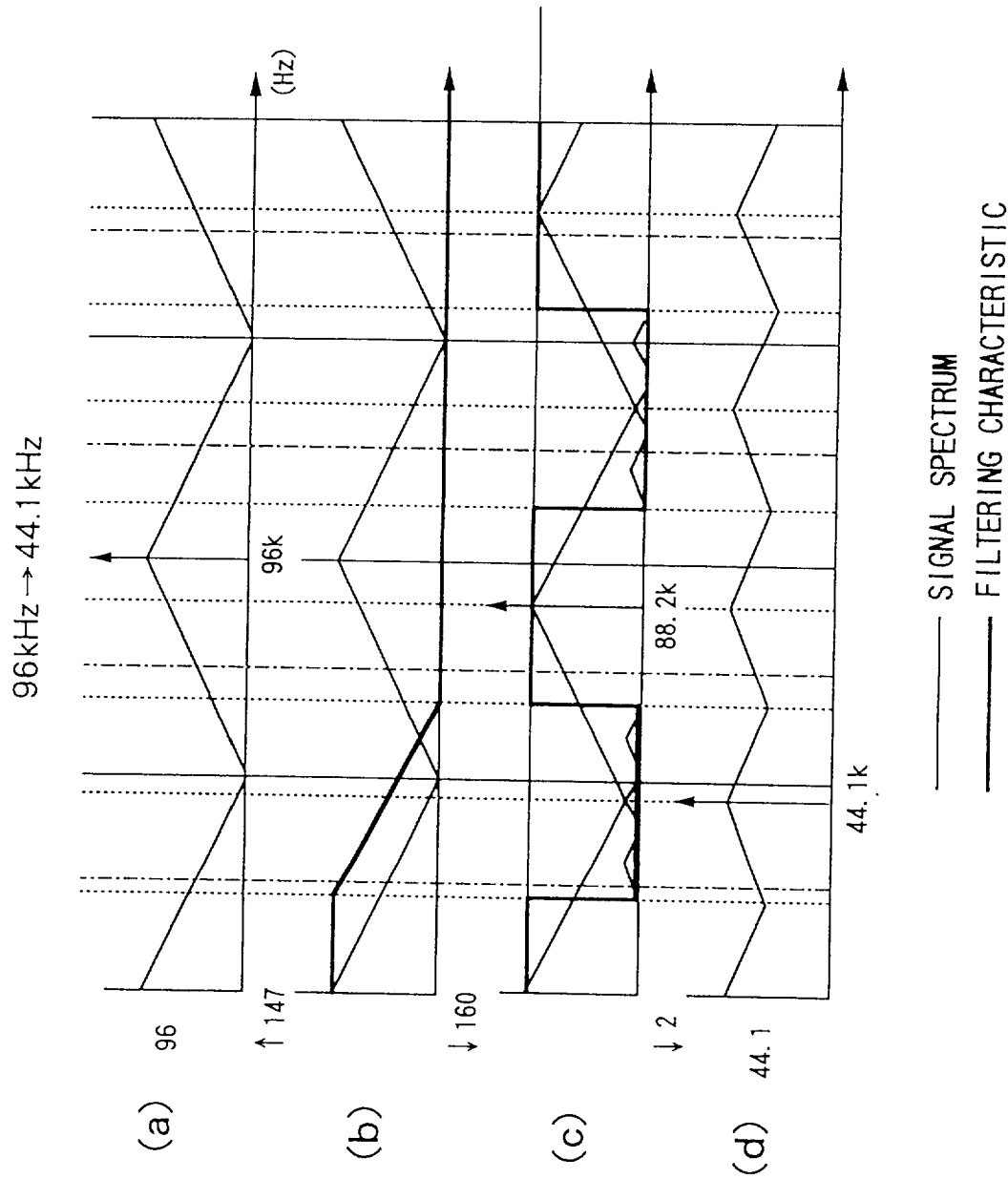

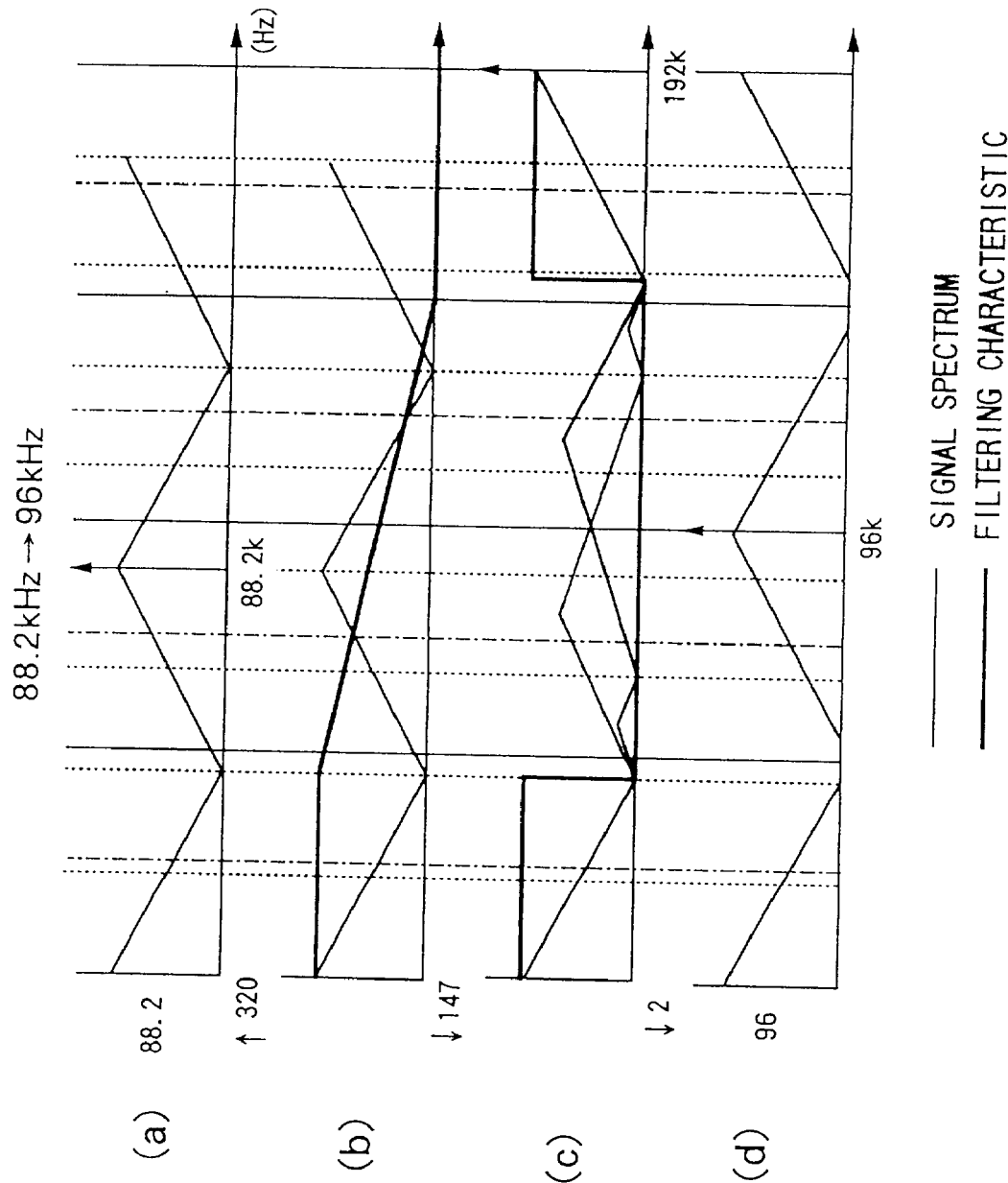

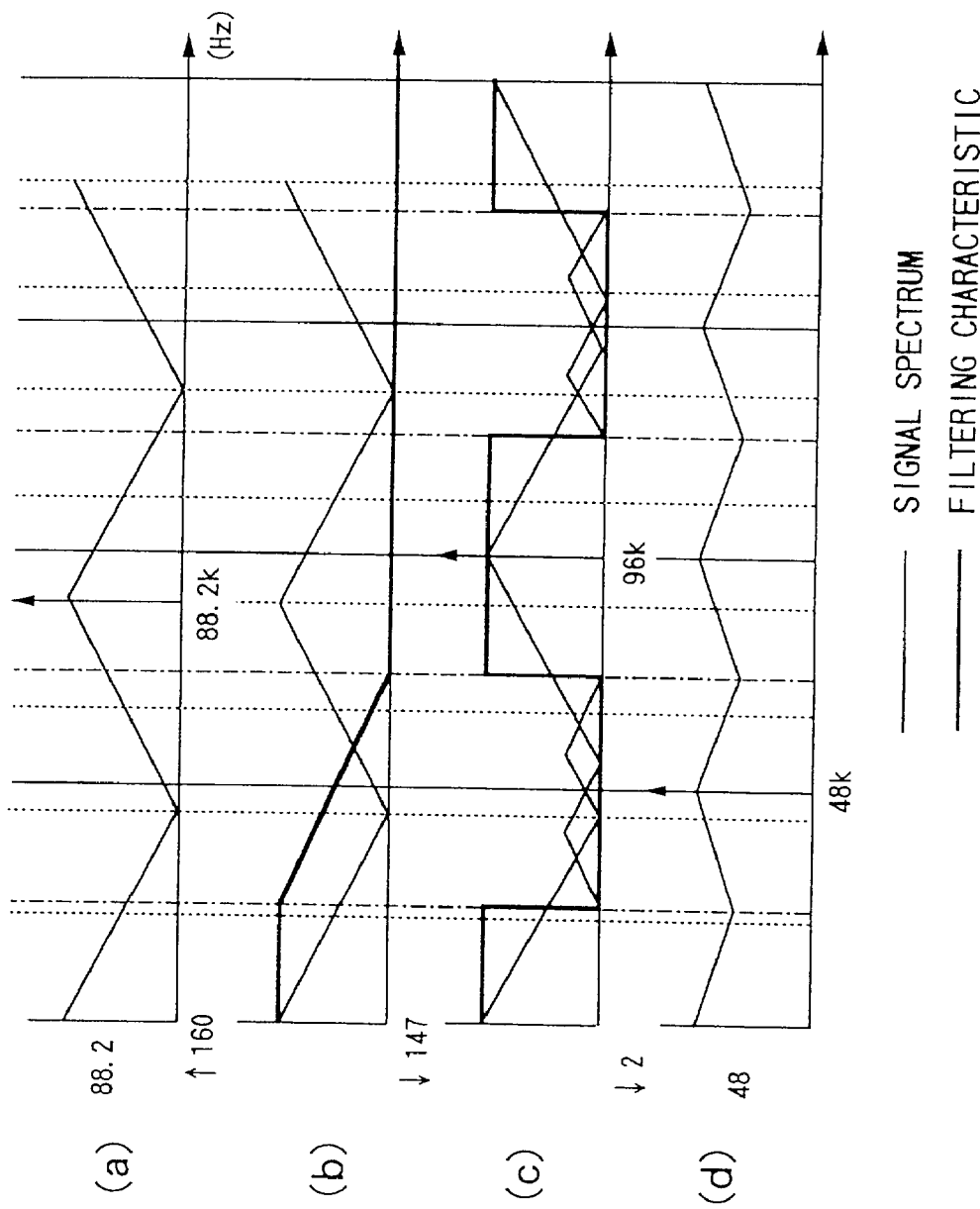

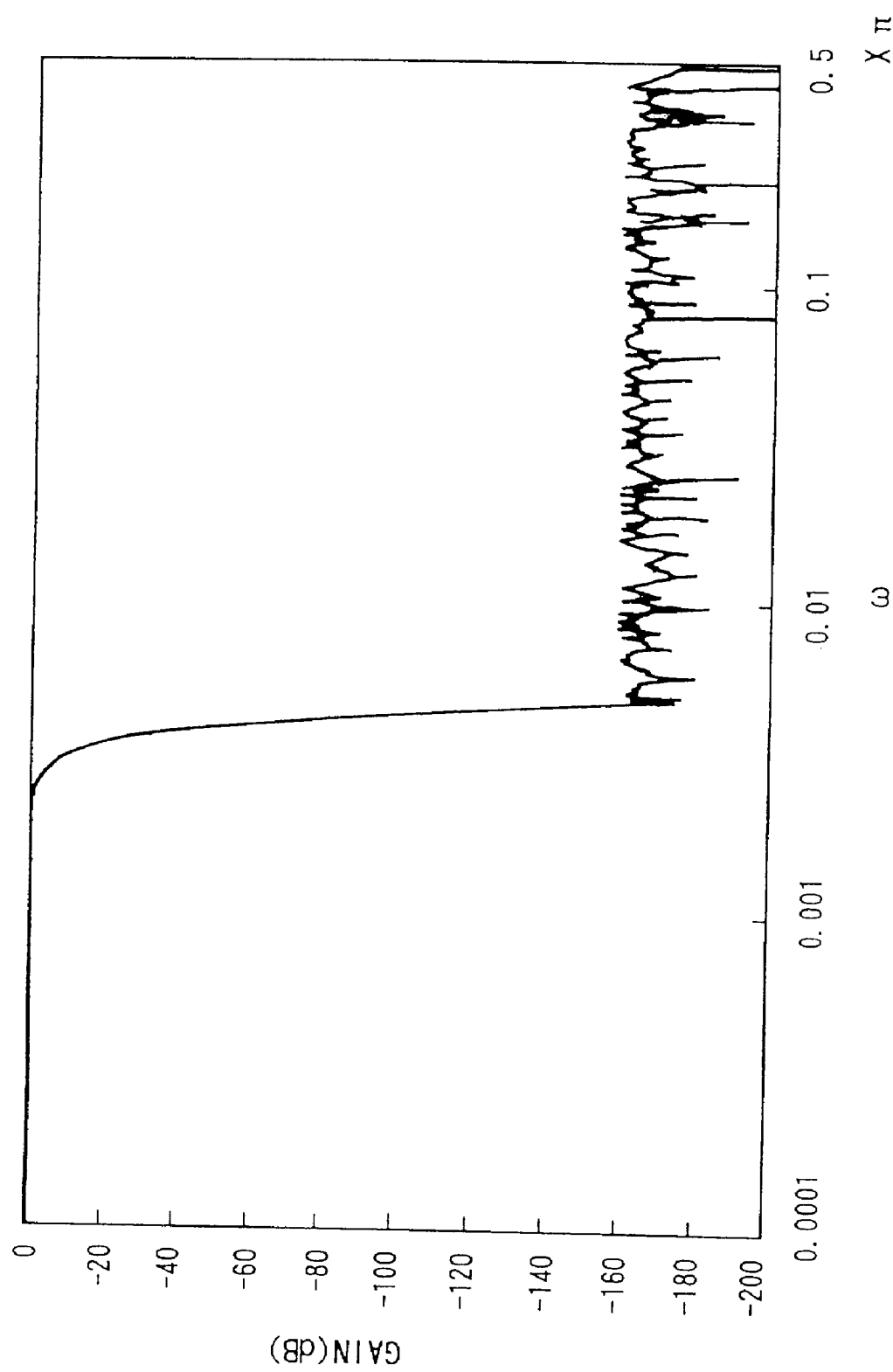

FIG.11A

| INPUT (kHz) / OUTPUT (kHz) | 44.1 | 48 | 88.2 | 96 |
|---|---|---|---|---|
| 32 | 2*(160/147) | 2*1 | 1*(160/147) | 1*1 |
| 44.1 | 1*1 | 2*(147/160) | 1*1 | 1*(147/160) |
| 48 | 2*(160/147) | 1*1 | 1*(160/147) | 1*1 |
| 88.2 | 2*1 | 2*(147/160) | 1*1 | 2*(147/160) |
| 96 | 2*(160/147) | 2*1 | 2*(160/147) | 1*1 |

FIG.11B

| INPUT (kHz) / OUTPUT (kHz) | 44.1 | 48 | 88.2 | 96 |
|---|---|---|---|---|
| 32 | 1/3 | 1/3 | 1/3 | 1/3 |
| 44.1 | 1 | 1/2 | 1/2 | 1/2 |
| 48 | 1/2 | 1 | 1/2 | 1/2 |
| 88.2 | 1 | 1 | 1 | 1/2 |
| 96 | 1 | 1 | 1/2 | 1 |

PROTOTYPE LPF

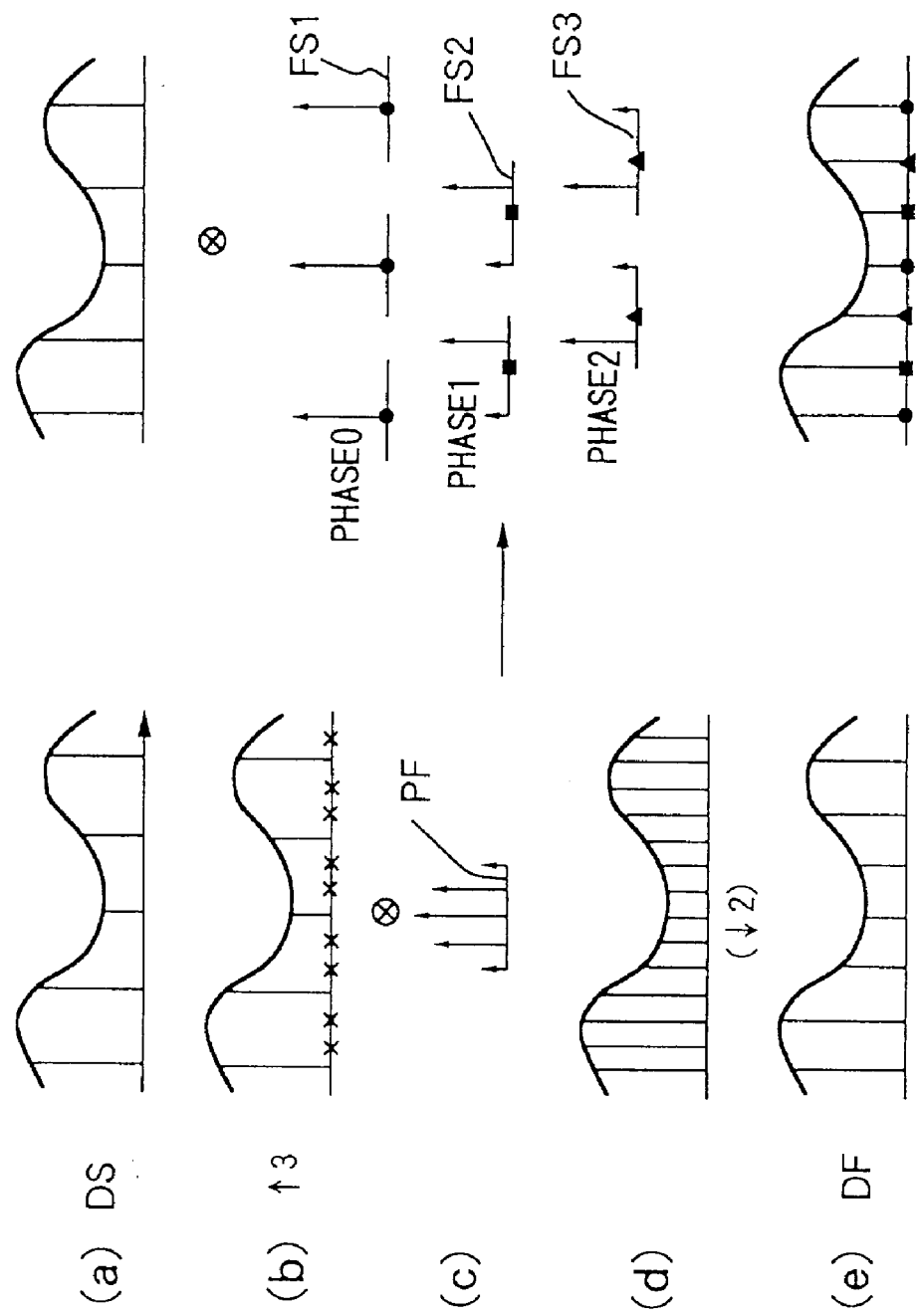

| y(m) | x [int(mM/L)] | gm%L(0) |
|---|---|---|
| m | 2m/3 | m%L |
| 0 | 0 | 0 |
| 1 | 0 | 1 |
| 2 | 1 | 2 |
| 3 | 2 | 0 |
| 4 | 2 | 1 |
| 5 | 3 | 2 |
| 6 | 4 | 0 |

FIG.32
PRIOR ART
(a) 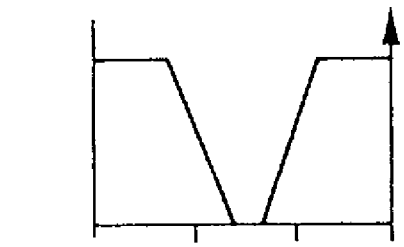
↑ 2
(b) 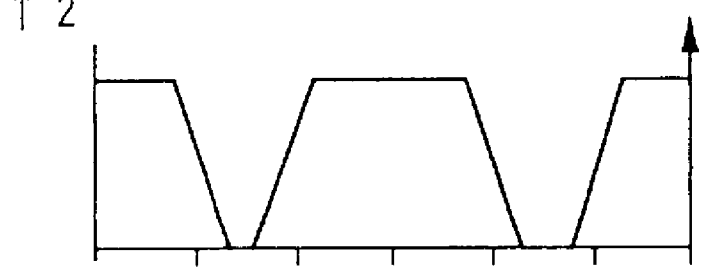
GAIN
(c) LPF 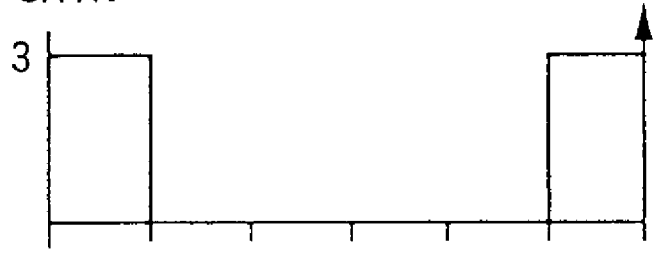
(d) 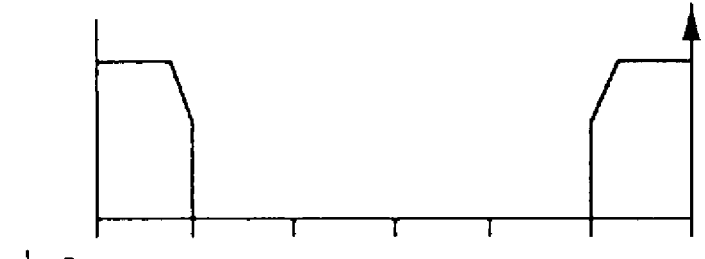
↓ 3
(e) 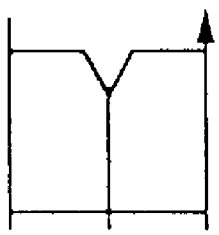

FIG. 33A
PRIOR ART
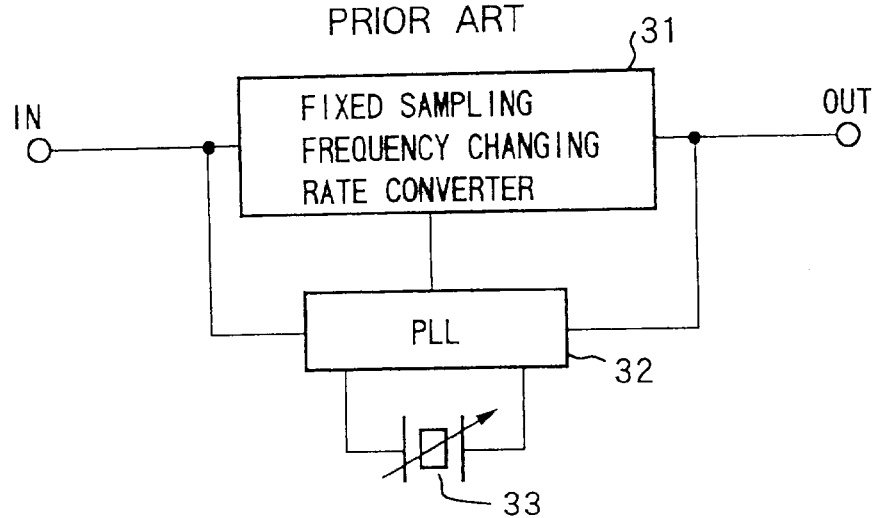
FIG. 33B
PRIOR ART
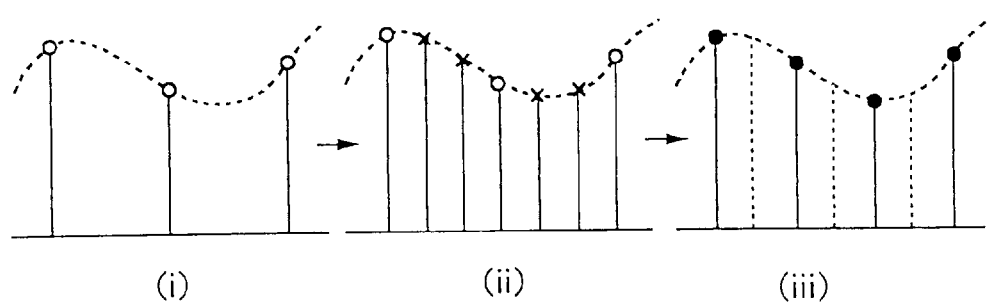
FIG. 34
PRIOR ART
| INPUT (kHz) / OUTPUT (kHz) | 44.1 | 48 | 88.2 | 96 |
|---|---|---|---|---|
| 32 | 320/441 | 2/3 | 160/441 | 1/3 |
| 44.1 | 1 | 147/160 | 1/2 | 147/320 |
| 48 | 160/147 | 1 | 80/147 | 1 |
| 88.2 | 2 | 147/80 | 1 | 147/160 |
| 96 | 320/147 | 2 | 160/147 | 1 |

(i)　　　　(ii)　　　　(iii)

SAMPLING FREQUENCY CONVERTING SYSTEM AND A METHOD THEREOF

BACKGROUND OF THE INVENTION

The present invention relates to a system for converting a digital audio data recorded at a sampling frequency to a digital data to be sampled at another sampling frequency, and a method thereof.

There are provided various types of digital audio systems, for example, compact discs (CDs) and digital-audio tape (DAT). Each system uses different sampling frequency (sampling rate) such as 96 kHz, 88.2 kHz, 48 kHz, 44.1 kHz, and 32 kHz. In order to record the digital data originally recorded on a digital audio system on another system, the original data must be converted into data at another frequency.

The most simple method for converting the digital data is to convert the digital data signal into an analog data signal. The analog data signal is further converted into a digital data signal at a desired sampling frequency which is different from the original sampling frequency. However, in the course of the conversion, noises and jitters are generated, thereby inevitably deteriorating and changing the sound quality.

There has been a demand for a method where the digital data is digitally processed to obtain another digital data.

The principle of one of the conventional method for converting the digital data having a sampling frequency fa Hz into a digital data having a sampling frequency fb Hz is described. First of all, the number of the sampling points is increased to the value of the least common multiple between the sampling frequencies fa and fb Hz. The number of the sampling points is decreased so that the number correspond to the sampling frequency fb Hz.

However, when these processes are carried out, noise due to an aliasing error is generated. In order to restrain the noise, the sampling is performed in accordance with the sampling theorem, or performed so that the noise is canceled. Moreover, an extremely large amount of calculation is necessary to precisely execute the process. Ingenious steps to decrease the calculation must be taken to put the method into actual use in hardware.

One of the conventional converting method is called a synchronous direct conversion method. For example, the method for converting the sampling frequency at a rate of 3/2 is described hereinafter with reference to FIGS. 31a to 31e, showing the changes in the spectrum of the data when the sampling frequency is converted.

First of all, two zero data are inserted in the two sampling point (sampled digital data) of the original digital data signal shown in FIG. 31a. Thereafter, the sampling frequency is expanded triple, namely, triple over-sampling is performed. FIG. 31b shows the spectrum after the insertion in accordance with the z transform and Fourier transformation.

Thereafter, an image component, which is generated upon the triple over-sampling, is removed by a low-pass filter (LPF) having a one-third band width as shown in FIG. 31d. Since the level of the direct current is reduced to one-third of the original level when the zero data are inserted, the triple DC gain of the LPF is imparted at the present step as shown in FIG. 31c.

At the next step, the number of sampling is reduced to one half, that is, one-half down-sampling is performed, by taking one data out of two. Thus as shown in FIG. 31e, the conversion of the sampling frequency is completed.

In another example, the sampling frequency is converted at the rate of 2/3 as shown in FIGS. 32a to 32e.

One zero data is inserted in the sampling point so that the sampling frequency is doubled. Namely, double over-sampling is performed. Thus the original spectrum shown in FIG. 32a is converted into the spectrum shown in FIG. 32b in accordance with the z transform and the Fourier formation.

Thereafter, an image component, which is generated upon the double over-sampling, is removed by the LPF having a one-third band width as shown in FIG. 32d. Since the level of direct current is reduced by one-half when the zero data are inserted, the double DC gain of the LPF is imparted at the present step as shown in FIG. 32c.

At the next step, the number of sampling is reduced to one-third, that is, one-third down-sampling is performed, by taking one data out of three. Thus as shown in FIG. 32e, the conversion of the sampling frequency is completed.

As described above the method of converting the sampling frequency at a rate of L/M where L and M are natural numbers, can be generalized as follows.

(1) (L-1) number of zero data are inserted in adjacent sampling point so that the sampling frequency is increased L times.

(2) An LPF having either a 1/L band width or a 1/M band width whichever is narrower, is used to remove an image component generated during the over-sampling. Since the DC level is reduced to 1/L when the zero data are inserted, the DC gain of the LPF is L times.

(3) One data out of M sampling data is taken, thereby decreasing the number of sampling to 1/M.

Although the LPF used in the case of converting at the rate L/M and the LPF used in the case of converting at the rate M/L differ in DC gains, they have the same cutoff frequency.

FIG. 33a shows a block diagram of a sampling frequency converting system for converting the sampling frequency in accordance with the synchronous direct conversion method. The system comprises a fixed sampling frequency changing rate converter 31 and phase-locked loop (PLL) circuit 32 to which is connected an oscillator 33, the oscillating frequency of which is variable. The input signal is applied both to the converter 31 and the PLL circuit 32 so that the timings of the input signal and the output signal are synchronized.

As shown in a graph (i) in FIG. 33b, the data of the input signal are sampled at the sampling points indicated by white dots. When converting the sampling frequency at the rate of 3/2, the sampling points are increased three times as shown by xs in a graph (ii). Every other point is selected as shown in black dots in a graph (iii) to obtain digital data wherein the sampling frequency is converted.

Since the conversion rate is fixed, the accuracy of the synchronous direct converting method depends on the precision of the LPF as the conversion filter. Moreover, in order to synchronize the input and output signals of the fixed sampling frequency changing rate converter 31, it is necessary to provide the PLL circuit 32. Hence the conversion accuracy is not affected by a time jitter of the input signal. Namely, the same process as that executed in a computer is carried out.

In the above described synchronous direct conversion method, a large amount of calculation is required although the conversion is carried out at a single fixed rate. In order to render it possible to convert the sampling frequency at various rates, the amount of calculation must be further increased. Hence it is difficult to provide hardware capable of performing such a conversion.

Moreover, there are cases where it is necessary that the input and output signals of the converter are asynchronous with each other, such as when converting video signals.

On account of these problems, most of the sampling frequency conversion systems which are currently on the market use asynchronous indirect conversion method.

In the asynchronous indirect conversion method, the sampling frequency of the output signal is a fixed desired frequency. When input signals having various sampling frequencies are applied to the conversion system, the sampling frequency thereof detected by some means or other and the conversion rate is adaptively changed as necessary. Since the conversion rate is variable, it is impossible to provide the system with conversion filters for every possible situation.

Referring to FIG. 35a, an asynchronous indirect conversion system comprises a variable sampling frequency changing rate converter 34, and a counter 35 to which is connected an oscillator 36 generating a signal at a fixed frequency. The counter 35 counts a sampling frequency of the input signal by a sampling frequency of the output signal.

As shown in a graph (i) of FIG. 35b, the input signal, the sampling points of which are shown by the white dots, is over-sampled by a power of 2, for example, amounting to several hundreds, for the ease of the processing.

The input frequency is converted using the output frequency as shown in the graph (ii). The signal undergoes such process as averaging so that the conversion rate is determined. As shown in the graph (iii), the data at the sampling points indicated by triangles is determined in accordance with the adjacent sampling points indicated by the black dots by a simple process such as linear interpolation.

More specifically, in order to convert the sampling frequency at the rate of 3/2 times, the input signal is double over-sampled and the data at the desired sampling points are calculated by linear interpolation.

In the asynchronous in direct conversion method, the PLL circuit is not necessary, and a conventional over-sampling IC can be used for over-sampling. Hence the method can be easily applied to hardware and ICs. In addition, input signals with jitters are processed by changing th e conversion rate, the clocking precision is increased. Hence the converter also serves as a jitter reducer.

FIG. 34 shows a table showing the conversion rates in principle between the input sampling frequencies and output sampling frequencies. As seen from the table, if the asynchronous indirect conversion is to be carried out to the principle, over-sampling with a conversion filter as much as 320 times at maximum becomes necessary. This requires the conversion filter to be provided with more than 30,000 taps if the precision of 24 bits is to be realized.

FIG. 36 shows a spectrum of an audio signal of 10.007 kHz in the form of a sine wave reproduced from a CD, the sampling frequency of which 44.1 kHz, and converted into an audio signal having a sampling frequency of 48 kHz. As shown in the graph, the spectrum after the conversion changes with time so that the main lobe is expanded. Hence the desired precision is not obtained.

In the synchronous direct conversion method, the spectrum of the signal changes after the conversion so that it is impossible to achieve a desired precision in principle. In addition, the synchronous direct conversion is effective in the cases where digital data are converted into analog data, and vice versa. In the case of digital to digital conversion, the conversion rate is changed to absorb the jitters and the absolute differences. Therefore, the frequency components of the resultant signal differs from those of the original signal. The sound quality is inevitably deteriorated.

Another problem inherent in the conventional conversion system is that, in order to improve the accuracy of the conversion, the over-sampling must be performed before the conversion at a large number. Namely, for the purpose of obtaining a precision of about 20 bits, the over-sampling must be performed at several hundred times at the least. If more precise conversion is required, the scale of the hardware must be increased. Moreover, since the conversion rate is calculated in accordance with the input and output clock, the source having jitters cannot be accurately converted.

In order to solve these problems, it is conceivable to use a synchronous indirect conversion method. However, the over-sampling must still be performed at a large number to increase the accuracy, thereby increasing the scale of the hardware.

SUMMARY OF THE INVENTION

An object of the present invention is to provide a system for converting data sampled at a predetermined sampling frequency to data which is different from the input data in sampling frequency, wherein a real-time and precise conversion is carried out with a simple device.

According to the present invention, there is provided a sampling frequency converting system wherein an input signal having a first sampling frequency which is one of frequencies of 96 (kHz), 88.2 (kHz), 48 (kHz), and 44.1 (kHz) is converted to an output signal having a second sampling frequency which is one of frequencies of 96 (kHz), 88.2 (kHz), 48 (kHz), 44.1 (kHz), and 32 (kHz).

The system comprises over-sampling means for passing the input signal based on the first sampling frequency and for outputting as a sampling signal, or for double over-sampling the input signal and for outputting as a sampling signal, conversion filtering means having a prototype filter for filtering the sampling signal at one of conversion rates of 147/160, 160/147, and 1/1, based on the first sampling frequency and the second sampling frequency, and for outputting as a filtering signal, low pass filter means having a predetermined cutoff frequency band for passing a low frequency range of the filtering signal for outputting a low frequency signal, and down-sampling means for passing the low frequency signal based on the first sampling frequency and the second sampling frequency for outputting as the output signal, or for down-sampling the low frequency signal by one half or one third for outputting as the output signal.

The conversion filtering means forms a plurality of sub-filters in accordance with a plurality of filter coefficients of the prototype filter corresponding to a plurality of phases, polyphase filter means is formed by changing over the sub-filters, the filtering signal is directly produced from the sampling signal by the polyphase filter means.

The conversion filtering means has a prototype filter having a band width smaller than a transition band width corresponding to the conversion from the input signal having the sampling frequency of 48 (kHz) to the output signal having the sampling frequency of 88.2 (kHz).

The conversion filtering means is formed into a multi-stage composition comprised of a plurality of sub-conversion filter means connected in multi-stages.

The conversion filtering means has first sub-conversion filter means for performing 1/49 down-sampling, and second sub-conversion filtering means for performing 1/3 down-sampling.

A tap coefficient of the conversion filtering means is determined such that a gain error produced between the phases becomes a smaller value than a standard error.

The system further comprises dither adding means for adding digital dither to the output signal for outputting as a dither added output signal, and noise shaping means for performing noise shaping of the dither added output signal and for outputting a dither noise shaping output signal.

The present invention further provides a sampling frequency converting method wherein an input signal having a first sampling frequency which is one of frequencies of 96 (kHz), 88.2 (kHz), 48 (kHz), and 44.1 (kHz) is converted to an output signal having a second sampling frequency which is one of frequencies of 96 (kHz), 88.2 (kHz), 48 (kHz), 44.1 (kHz), and 32 (kHz).

The steps comprises passing the input signal based on the first sampling frequency and outputting as a sampling signal, or double over-sampling the input signal and outputting as a sampling signal, filtering the sampling signal at one of conversion rates of 147/160, 160/147, and 1/1 by using a prototype filter, based on the first sampling frequency and the second sampling frequency, and outputting as a filtering signal, passing a low frequency range of the filtering signal and outputting a low frequency signal, and passing the low frequency signal based on the first sampling frequency and the second sampling frequency, and outputting as the output signal, or down-sampling the low frequency signal by one half or one third, and outputting as the output signal.

The conversion filtering step comprises performing direct filtering of the sampling signal by polyphase filter means.

The conversion filtering step is composed by a multi-stage composition having a plurality of sub-conversion filters.

The conversion filtering step includes first sub-conversion filtering step performing 1/49 down-sampling, and second sub-conversion filtering step performing 1/3 down-sampling.

The method further comprises adding digital dither to the output signal, and performing noise shaping of the dither added output signal.

These and other objects and features of the present invention will become more apparent from the following detailed description with reference to the accompanying drawings.

BRIEF DESCRIPTION OF DRAWINGS

FIGS. 2a–2d show graphs of spectrums during a conversion of a sampling frequency from 48 kHz to 88.2 kHz;

FIGS. 3a–3d show graphs of spectrums during a conversion of a sampling frequency from 48 kHz to 44.1 kHz;

FIGS. 4a–4d show graphs of spectrums during a conversion of a sampling frequency from 44.1 kHz to 96 kHz;

FIGS. 5a–5d show graphs of spectrums during a conversion of a sampling frequency from 44.1 kHz to 48 kHz;

FIGS. 6a–6d show graphs of spectrums during a conversion of a sampling frequency from 96 kHz to 88.2 kHz;

FIGS. 7a–7d show graphs of spectrums during a conversion of a sampling frequency from 96 kHz to 44.1 kHz;

FIGS. 8a–8d show graphs of spectrums during a conversion of a sampling frequency from 88.2 kHz to 96 kHz;

FIGS. 9a–9d show graphs of spectrums during a conversion of a sampling frequency from 88.2 kHz to 48 kHz;

FIG. 10 is a graph showing a frequency response of a conversion filter provided in the conversion system of FIG. 1;

FIGS. 11a and 11b show tables of conversion rates;

FIGS. 14a to 14e are graphs explaining a procedure for converting at a rate of 3/2 using the polyphase filter;

FIGS. 32a through 32e show graphs explaining a procedure for converting a sampling frequency at a rate of 2/3 in a conventional conversion system;

FIG. 33a is a block diagram of a conventional conversion system using a synchronous direct conversion method;

FIG. 33b are graphs explaining the synchronous direct conversion method;

FIG. 34 is a table showing sampling frequency conversion rates in principle;

DETAILED DESCRIPTION OF THE PREFERRED EMBODIMENT

Figure 1:
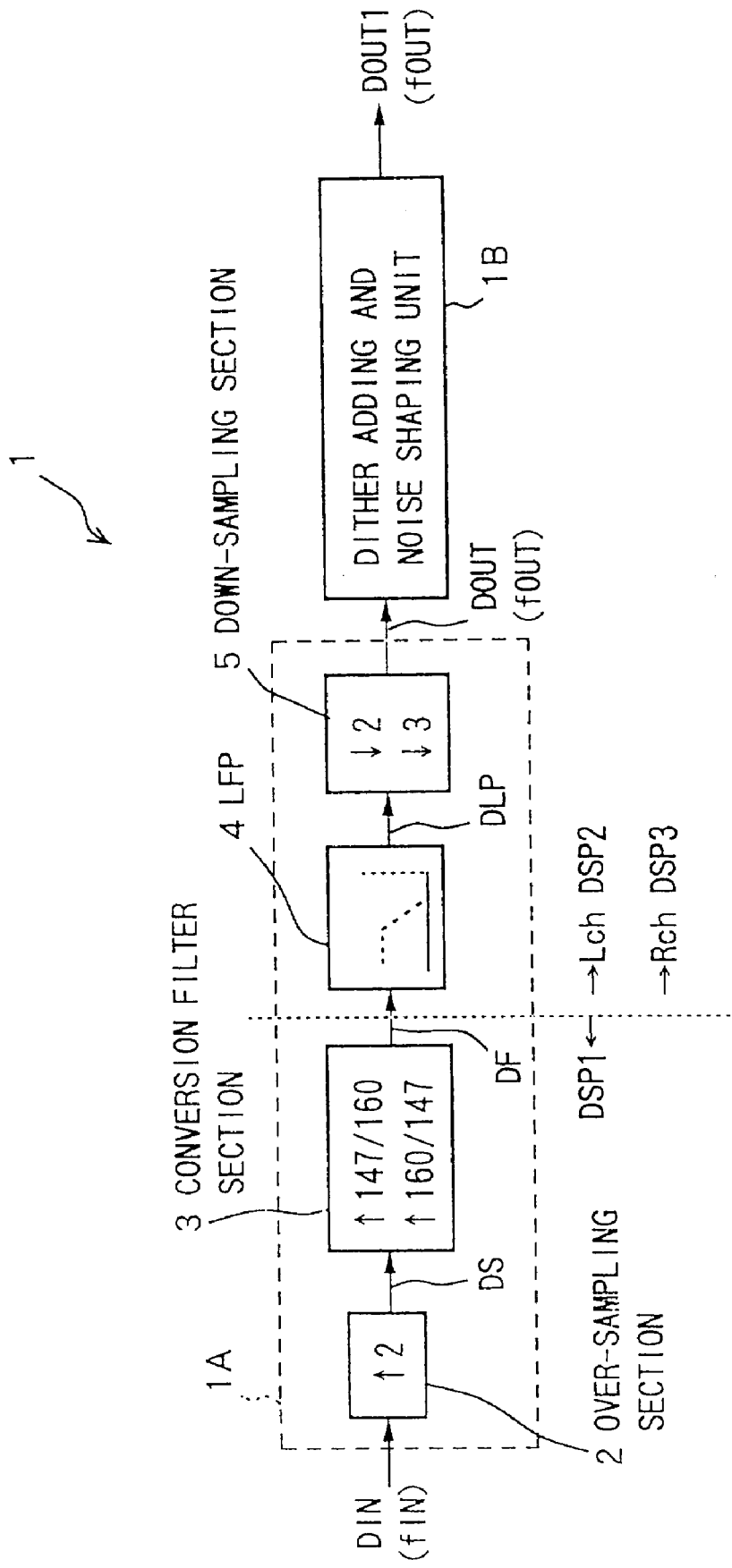
FIG. 1 is a schematic block diagram of a sampling frequency conversion system of the present invention.

Referring to FIG. 1, a sampling frequency conversion system according to the present invention comprises a sampling frequency conversion unit 1A wherein an input signal $D_{IN}$ which represent data sampled at a sampling frequency $f_{IN}$. The input signal $D_{IN}$ is converted into an output signal $D_{OUT}$ which represents data sampled at another sampling frequency $f_{OUT}$. The first sampling frequency $f_{IN}$ is one of the frequencies 96 kHz, 88.2 kHz, 48 kHz and 44.1 kHz, and the second sampling frequency $f_{OUT}$ is one of the frequencies 96 kHz, 88.2 kHz, 48 kHz, 44.1 kHz and 32 kHz.

The sampling frequency conversion unit 1A comprises an over-sampling section 2, conversion filter section 3, low-pass filter (LPF) 4, and down-sampling section 5. The input signal $D_{IN}$ is fed to the over-sampling section 2 wherein the input signal $D_{IN}$ is either passed through without any processing, or converted into an over-sampling signal $D_S$ by double over-sampling the input signal. The over-sampling signal $D_S$ is filtered at the conversion filter section 3 at the conversion rate 147/160, 160/147, or 1/1. Namely, the over-sampling signal $D_S$ is further over-sampled, or interpolated, and down-sampled, or decimated, thereby forming a filtering signal $D_F$. A low pass band component signal $D_{LP}$ is generated when the filtering signal $D_F$ passes through the LPF 4.

At the down-sampling section 5, the low pass band component signal $D_{LP}$ is either passed through without any processing, or down-sampled by one half, or by one third. Hence the output signal $D_{OUT}$ is generated.

The output signal $D_{OUT}$ is fed to a dither adding and noise shaping unit 1B where the deficiency in the signal $D_{OUT}$ and the harmonic distortion caused during re-quantization of the input signal $D_{IN}$ are compensated by adding a dither or by noise shaping. Hence a compensated output signal DOUT-$_{OUT1}$ is formed.

In practice, the sampling frequency conversion system comprises three digital processors DSP1, DSP2, and DSP3. The first digital processor DSP1 includes the over-sampling section 2 and the conversion filter section 3. The second digital processor DSP2 includes the LPF 4 and the down-sampling section 5, dither adding and noise shaping unit 1B for the left channel, and the third digital processor DSP3 includes the LPF 4 and the down-sampling section 5, dither adding and noise shaping unit 1B for the right channel.

When the input signal $D_{IN}$ representing data sampled at the sampling frequency of 96 kHz is to be converted into the output signal $D_{OUT}$ representing data sampled at 32 kHz, 44.1 kHz, 48 kHz or 96 kHz, or the input signal $D_{IN}$ representing data sampled at the sampling frequency of 88.2 kHz is to be converted into the output signal out representing data sampled at 32 kHz, 44.1 kHz, 48 kHz or 88.2 kHz, the input signal $D_{IN}$ passes through the over-sampling section 2 without any processing. On the other hand, in the case of other conversion rates, zero points are inserted as described in relation to the conventional system with reference to FIGS. 32a and 32b, thereby executing the double over-sampling. In the actual process, the double over-sampling process is not independently carried out since the zero point is merely inserted. The process in the conversion filter section 3 is doubled instead. Namely, when the rate of the over-sampling is 160 times, the 320/147 times process can also be carried out. When the over-sampling is 147 times, the 294/160 times process is also carried out.

The manner in which the conversion filter section 3 shared in various conversion rates is described in detail.

In principle, it is necessary to provide discrete filter for each conversion rate in the conversion filter section 3. However, the same filter may be used for conversion rates L/M and M/L, so that only four filters are necessary. FIGS. 2 to 9 describe each of the fractional rate conversion steps of the sampling frequency in each case except for when the output signal is sampled at the frequency 32 kHz.

The sampling frequency conversion system 1 is constructed to perform a multiple stage, using conversion rate shown by tables in FIGS. 11a and 11b. The conversions can be divided into the following three types.

(1) The sampling frequency 44.1 kHz or the sampling frequency 48 kHz is converted into one of the sampling frequencies 32 kHz, 44.1 kHz, 48 kHz, 88.2 kHz and 96 kHz.

(2) The sampling frequency 88.2 is converted into 48 kHz.

(3) The sampling frequency 96 kHz is converted into 44.1 kHz.

Namely, the second sampling frequency at the conversion filter section 3 after the first over-sampling at the over-sampling section 2 becomes constant. Hence the filtering characteristics required of the conversion filter section 3 in each case become quite similar. Accordingly, one conversion filter section 3 can be used in common in all cases.

When converting the sampling frequency 88.2 kHz to the sampling frequency 96 kHz, or the sampling frequency 96 kHz to 88.2 kHz, the sampling frequency is doubled, so that it may appear necessary to provide another conversion filter section 3 having a different filtering coefficient. However, the frequency characteristic is also expanded twice, so that the same filtering coefficient can be used. That is, the conversion filter section 3 can be shared.

More particularly, it is desirable to use a filter having characteristics appropriate for converting the sampling frequency 48 kHz to the sampling frequency 88.2 kHz as a prototype filter. It should be noted that the prototype is a model suitable for use in complete evaluation of form, design, and performance. Since the transition band width is narrow, the most strict filtering characteristic is required for such a case. Accordingly, a single filter coefficient can be applied to all of the fraction conversion frequency.

Four types of filters are necessary for forming the LPF 4. Namely, each filter has the cutoff frequency fc as follows.
fc=π/6
fc=π/4
fc<π/4
fc>π/4

While the number of taps of the filters comprising the LPF 4 are 150 to 350, the conversion filter section 3 requires about 3520 taps. Hence the total of the memory for the tap coefficient can be greatly reduced.

FIG. 10 shows the frequency characteristic of the conversion filter section 3 which satisfies the above described sharing conditions. The noise floor of the 24 bits is 146.2 dB so that, taking a multiple stage filter construction in consideration, it suffices to so design the conversion filter section 3 that the ripple thereof is about −152 dB. However, when the filter having a finite tap length is divided by polyphase resolution, there is generated a difference between the gain at each phase. Thus the input level fluctuates when the direct current is input.

In order to resolve such a problem, the tap coefficients are set by iteration so that a DC gain at the filter of each phase becomes constant. However, in the present embodiment, since all of the fractional rates are adapted to be processed with a single prototype filter, the tap coefficient must be adjusted each time the conversion rate changes. Moreover, since the output of the first digital processor DSP1 includes noises caused by the aliasing error, when the direct current is applied, there is generated a harmonic wave which is inevitably an image component and not a harmonics tone.

Hence, the adjustment of the DC gain cannot be effected. In order to prevent such a drawback, the conversion filter section 3 is designed so that the specification thereof is appropriate for more severe conditions. More particularly, the filter is so designed that the allowable ripple becomes about −158 dB. Thus the provided tap coefficient becomes larger than necessary. Thus the fluctuation in gains after polyphasing is restrained sufficiently smaller than 24 bits LSB.

The tables in FIGS. 11a and 11b show the actual conversion rates of the three digital processors DSP1, DSP2 and DSP3 which include as the over-sampling section 2, conversion filter section 3, LPF 4 and the down-sampling section 5.

For example, when the sampling frequency $f_{IN}$ of the input signal $D_{IN}$ is 44.1 kHz, and the sampling frequency $f_{OUT}$ of the signal $D_{OUT}$ is 32 kHz, the conversion rate of the first digital processor DSP1 is

2 * [160/147]

as shown in FIG. 11a. Namely, at the over-sampling section 2, double over-sampling is carried out. At the conversion filter section 3, the conversion rate 160/147 is used. At the LPF 4, 320 times gain including the gain of the over-sampling section 2 is obtained.

The conversion rate at each of the second and third digital processors DSP2 and DSP3 is 1/3 as shown in FIG. 11b. Hence the 1/3 down-sampling is carried out at the down-sampling section 5.

In the case where the sampling frequency $f_{IN}$ of the input signal $D_{IN}$ is 88.2 kHz and the sampling frequency $f_{OUT}$ of the output signal $D_{OUT}$ is 48 kHz, the conversion rate at the first digital processor DSP1 is

1 * [160/147]

Namely, the input signal $D_{IN}$ is passed through the over-sampling section 2 without inserting any zero points. The conversion rate at the conversion filter section 3 becomes 160/147 so that the gain at the LPF 4 becomes 160 times. On the other hand, the conversion rate at each of the second and third digital processors DSP2 and DSP3 is 1/2, so that the one half down-sampling is performed at the down-sampling section 5.

The multiple stage filter and polyphase filter used in the present embodiment for reducing the calculating amount and the size of the device will be described hereinafter.

Upon converting the sampling frequency, when either one of the interpolation rate or the decimation rate is large, it is possible to reduce the number of the taps of the filter, if the conversion filter section 3 is divided into multiple stages than when the filter is a single stage filter.

Figure 12A:
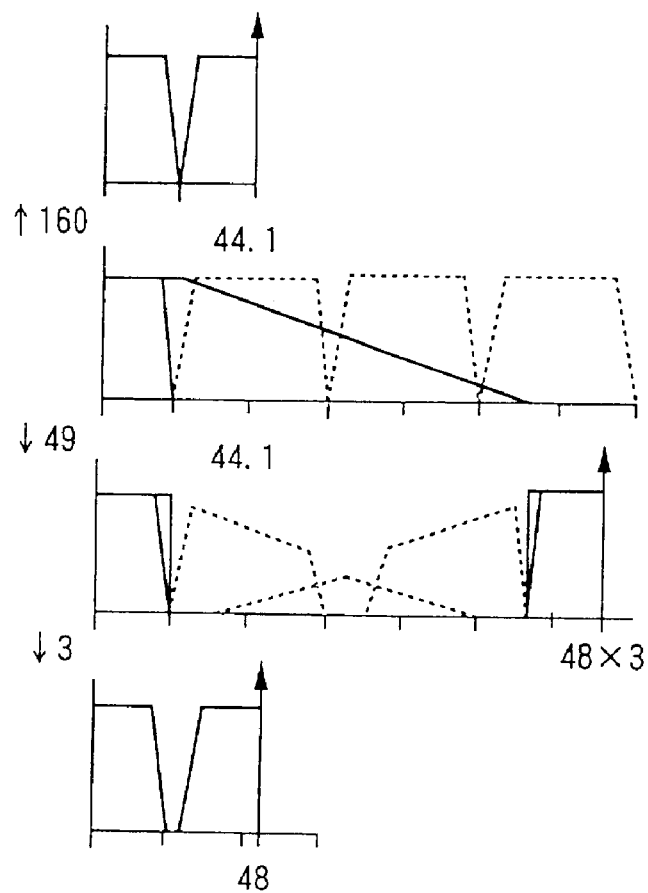
FIG. 12a shows graphs explaining a conversion procedure using a multiple stage filter.
Figure 12B:
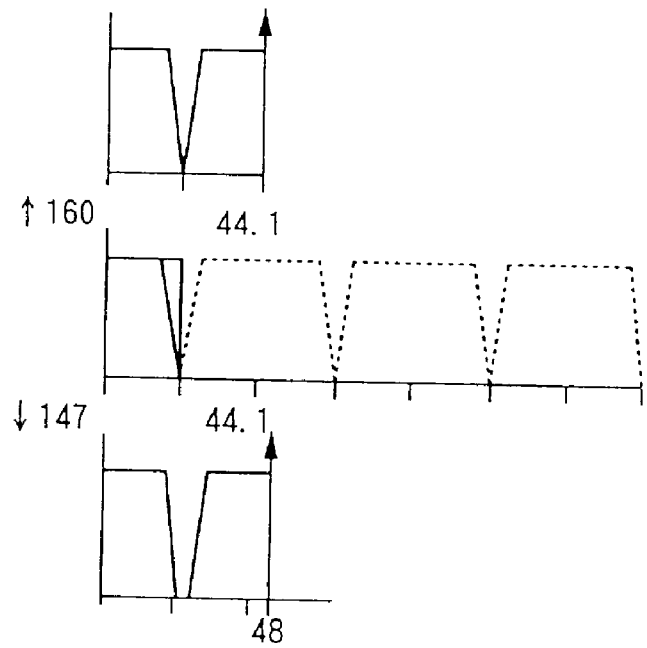
FIG. 12b shows graphs explaining a conversion procedure using a single stage filter.

For example, when the input sampling frequency $f_{IN}$ is 44.1 kHz and the output sampling frequency is 48 kHz, the procedure of the conversion using the single stage filter is shown in FIG. 12b. First of all, in order to obtain data sampled at a frequency corresponding to the least common multiple between the frequencies 44.1 kHz and 48 kHz, 160 times over-sampling is carried out. The 160 times over-sampling signal is applied to a filter having a sharp cut-off characteristic to remove the image components shown by a dotted line in FIG. 12b. The 160 times over-sampling signal is down-sampled by 1/147.

The calculation required for removing the image component from the 160 times over-sampling signal is explained as follows.

The number N of the taps provided in an equal ripple filter is calculated in accordance with the following equation (1).

$$N \approx D(\delta p, \delta s)/(\Delta F/Fs) \quad (1)$$

$$D(\delta p, \delta s) = \log 10(\delta s)\{0.00539[\log 10(\delta p)]^2 + 0.071 14\log 10(\delta p) - 0.4761\} - 0.00266[\log 10(\delta p)]^2 - 0.5941\log 10(\delta p) - 0.4278$$

wherein δp is a pass band ripple, δs a stop band ripple, ΔF a transit band width, and $F_S$ is a sampling frequency. When
 δp=−150 dB,
 δs=−150 dB, and
 ΔF=2 kHz, The number $N_S$ of taps needed in the signal stage filter is calculated as $N_S$=32377 ($F_s$=160×44.1 kHz)

On the other hand, the present embodiment uses a multiple stage filter having a first filter for 1/47 down-sampling and a second filter for 1/3 down-sampling as shown in FIG. 12a. After the processing by the first filter, there is formed a signal within a band between 44.1/2 kHz and (48×3−44.1/2) kHz, which signal is ultimately unnecessary. The signal in the band is thereafter removed so that it does not matter whether the signal includes noises caused by aliasing error. Accordingly, it is not required to provide a filter with a sharp cut-off profile as that for the single stage filter. A filter with a gradual cut-off profile shown in FIG. 12a will suffice. Namely, in a range where the frequency is high, a gradual filter having less taps, that is a filter which requires a smaller amount of calculations is used. When the frequency becomes lower, a filter with a sharp cut-off profile is used to remove the noises. The first and second filters are designed based on the following conditions. For the first filter,
 δp=−156 dB,
 δs=−150 dB, and
 ΔF=48×3−44.1 kHz For the second filter,
 δp=−156 dB,
 δs=−150 dB, and
 ΔF=2 kHz It should be noted that the ripple of the combined characteristic of the multiple stage filter comprising the first and second filters corresponds to the ripple multiplied by the ripple at each stage. Hence the pass band ripple δp must be set with consideration to the multiplied ripple. The stop band ripple δs serves to restrain the ripple so that it can be left as it is without any further consideration.

The number Nm1 of taps necessary in the first stage is,
 Nm1=656 ($F_s$=160×44.1 kHz)

The number Nm2 of taps necessary in the second stage is,
 Nm2=671 ($F_s$=3×48 kHz)

Thus the amount of calculation is largely reduced compared to when the single stage filter is used.

It is further advisable that each of the first and second filters is a polyphase filter so that useless calculations are omitted.

The principle of converting the sampling frequency at the rate of L/M has already been explained as interpolating the sampling points L times and thereafter, decimating the points to 1/M. However, in accordance with the method, there is generated during the process, data which corresponds to the data sampled at the frequency L times the original sampling frequency, although the desired data is data sampled at the frequency of L/M times.

The sampling rate conversion process is now described with reference to FIGS. 13a to 13e showing the sampling points with respect to the time axis.

Figure 13A:
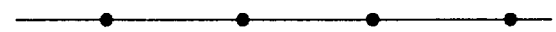
FIGS. 13a to 13e are diagrams explaining a conversion procedure using a polyphase filter.
Figure 13B:
Figure 13C:
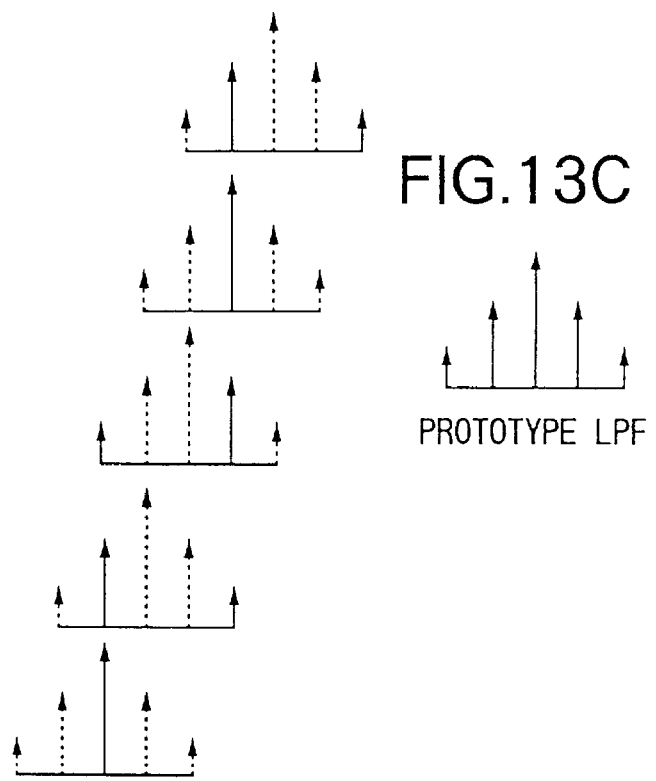
Figure 13D:
Figure 13E:

A zero data is inserted in the input signal $D_{IN}$ shown in FIG. 13a, to form an over-sampling data signal as shown in FIG. 13b. The prototype LPF shown in FIG. 13c is used for filtering, the result of which is shown in FIG. 13d.

As shown in FIG. 13b, two out of three over-sampling data corresponds to the zero data so that they need not be calculated. Namely, only one out of three over-sampling data need to be calculated. Hence, of the five filtering coefficients of the prototype LPF, only one out of the three coefficients is necessary for calculating the data shown in FIG. 13d, and the remaining two coefficients are not necessary.

More particularly, at a certain calculating timing, of the five filtering coefficients which are shown by five arrows in each prototype LPF, one or two coefficients shown by the solid arrows are necessary for calculating data. On the other hand, the remaining three or four filtering coefficients shown by the dotted arrows are the unnecessary ones. When decimating the calculated data shown in FIG. 13d to the data of the output signal $D_{OUT}$ shown in FIG. 13e, one out of two data is obliterated. Hence, by omitted the calculation of unnecessary data, or data which are not ultimately selected, the calculating amount can be decreased.

The polyphase filter is used to omit such useless calculations. The polyphase filter comprises a group of filters numbering L formed by a process called polyphase resolution, wherein every (L−1)th filtering coefficient of the original filter is selected to form a group. By changing over to one of these groups of filters, the filtering data can be directly obtained from the original data of the input signal $D_{IN}$ shown in FIG. 13a without calculating the L-multiplied sampling data. The memory for a convolution unit is shared by all the filters so that only a coefficient unit is changed at each operation for changing the filter.

The polyphase resolution is hereafter described in detail with reference to FIGS. 14a to 14e and 15a to 15e.

FIGS. 14a to 14e describe the polyphase resolution for converting the sampling frequency at the rate of 3/2. As shown in FIG. 14c, an original prototype filter PF, shown at the left side of the drawing is divided into three sub-filters $FS_1$, $FS_2$, and $FS_3$ by taking a filter coefficient at every (3−1), which are shown at the right side. By changing the sub-filter between these three, the sampling frequency can be converted.

At a first phase, indicated in FIG. 14c as the PHASE 0, the sub-filter $FS_1$ is used. At the second phase, PHASE 1, the sub-filter $FS_2$ is used, and at the third phase, PHASE 2, the sub-filter $FS_3$ is used. Thus the filtering signal $D_F$ representing the filtering data as shown in FIG. 14e can be derived from the over-sampling signal $D_S$ shown in FIG. 14a without going through the calculations shown in FIGS. 14b and 14d.

FIGS. 15a to 15e describe the polyphase resolution for converting the sampling frequency at the rate of 2/3. As shown in FIG. 14c, the original prototype filter PF, shown at the left side of the drawing, is divided into two sub-filters $FS_{11}$ and $FS_{22}$, which are shown at the right side. By changing the sub-filter between these two, the sampling frequency can be converted.

Figure 15:
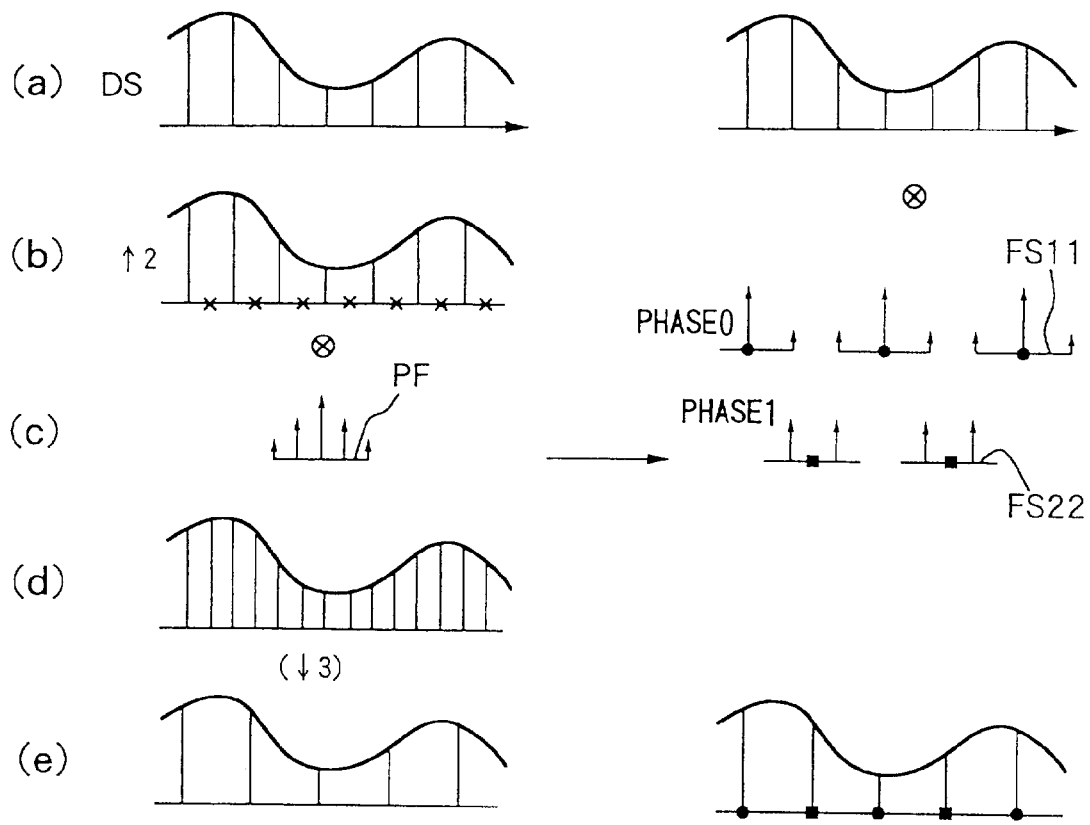
FIGS. 15a to 15e are graphs explaining a procedure for converting at a rate of 2/3 using the polyphase filter.

At a first phase, indicated in FIG. 15c as the PHASE 0, the sub-filter $FS_{11}$ is used. At the second phase, PHASE 1, the sub-filter $FS_{22}$ is used. Thus the filtering signal $D_F$ representing the filtering data as shown in FIG. 15e can be derived from the over-sampling signal $D_S$ shown in FIG. 15a without going through the calculations shown in FIGS. 15b and 15d.

The use of polyphase resolution is advantageous in the following two ways. Namely, from the point of the software, the calculating speed is increased and from the point of the hardware, a low clock frequency can be utilized. Moreover, less memory is necessary both for the software and the hardware.

In order to generalize the expression of the polyphase filters, it is necessary to express the filter by a numerical equation.

Figure 16:
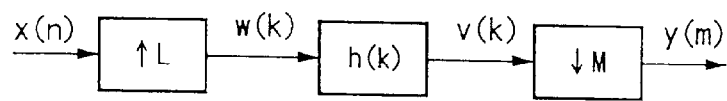
FIG. 16 is a diagram explaining a numerical equation of the polyphase filter.

Referring to FIG. 16, explaining a sampling frequency conversion system, a function v(k) which is a convolution of a function w(k) and a function h(k) representing an impulse response of the conversion filter, is expressed as follows.

$$v(k) = \sum_{l=-\infty}^{+\infty} h(k-l)w(l) \tag{2}$$

The function w(k) represents a signal wherein (L−1) zero data are inserted between the sampling points of a signal expressed by a function x(n). Hence, w(1)=x(1/L):1/L=r, w(1)=0:1/L≠r where r is an integer.

Therefore, v(k) is expressed as $$v(k) = \sum_{r=-\infty}^{+\infty} h(k-rL)x(r) \tag{3}$$

Because a function y(m) is a sample obtained from v(k) at every M sample, $$y(m)=v(Mm) \tag{5}$$

Thus the relationship between the input and output signals is expressed as, $$y(m) = \sum_{r=-\infty}^{+\infty} h(Mm - rL)x(r) \tag{6}$$

A term mM %L represents a remainder obtained when m×M is divided by L.

In order to clarify the index relationship between the input and the output signals, the following equation is obtained from the equations (3) and (5).

$$r=int(mM/L)-n \tag{7}$$

Thus the equation (6) is expanded as follows.

$$\begin{aligned} y(m) &= \sum_{n=-\infty}^{+\infty} h[mM - int(mM/L)L + nL]x[int(mM/L) - n] \\ &= \sum_{n=-\infty}^{+\infty} h[nL + mM \% L]x[int(mM/L) - n] \end{aligned} \tag{8}$$

The term h[nL+mM %L] represents the group of coefficients for each phase. When $$g_m(n)=h[nL+mM \% L] \tag{9}$$

there is a relationship of $$g_m(n)=g_{m+rL}(n): r=0, \pm 1, \pm 2, \tag{10}$$

If the number N of the prototype filter PF is an integral multiple of L, that is N=QL, $$y(m) = \sum_{n=0}^{Q-1} q_{m\%L}(n) x[\text{int}(mM/L) - n] \qquad (11)$$

where Q is the number of taps of filters in each phase. It can be seen from the equation that as the variable m is increased from 0 to L−1, thereby completing a cycle of relationship between the input and output signals, an input pointer proceeds from 0 to M−1. In other words, when L number of data are derived from M number of new input data, the calculation can be performed as a block.

Thus, when a input buffer having a length of "M+Q−1" is provided, the convolution is carried out using $g_{m\ \%L}$ groups of coefficients, so that L output data are generated.

Figures 17A, 17B:
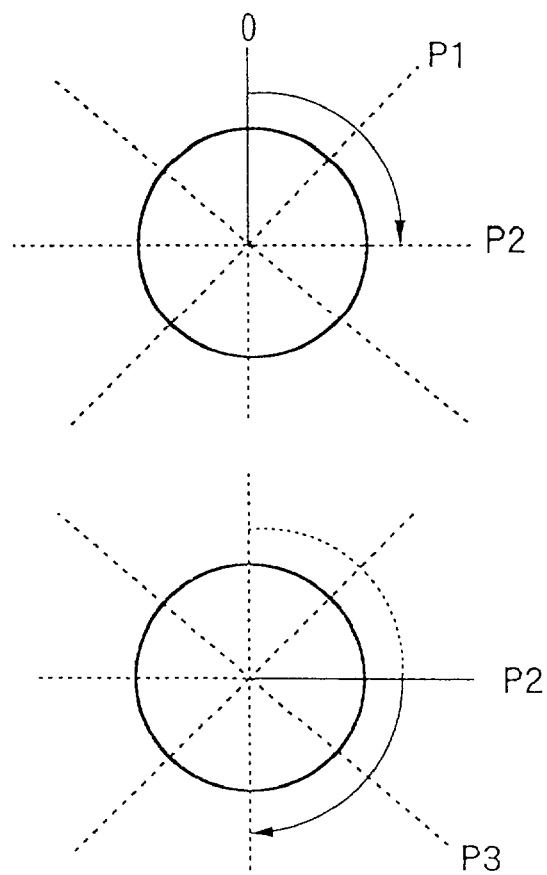
FIG. 17a is a table explaining a calculation of the polyphase filter.
FIG. 17b is a diagram showing ring buffers explaining the calculation of the polyphase filter.

FIG. 17a shows actual values of the pointers when L=3 and M=2. FIG. 17b shows a ring buffer having a capacity of "M+Q−1" used for calculating the values in FIG. 17a when N=21 and Q=7.

As shown in FIG. 17a, in order to obtain three output data, two new input data are necessary, and for the calculation, three groups of coefficients are necessary.

Referring to FIG. 17b, the calculating procedure is as follows.

(1) When the pointer is 0, the data stored in the ring buffer is initialized.

(2) At a point $P_1$, two new data, that is M data, are read out.

(3) L, that is, three, output data are then calculated at a point $P_2$ as follows.

$$y(0) = \sum_{n=0}^{6} g_0(n) x[-n],$$

$$y(1) = \sum_{n=0}^{6} g_1(n) x[-n],$$

$$y(2) = \sum_{n=0}^{6} g_2(n) x[1-n]$$

(4) The front end pointer is moved +M notches, that is, two notches to a point $P_3$.

(5) The processes (2) to (4) are repeated.

In the sampling frequency conversion system, although a larger amount of calculation is required if the output sampling frequency is close to the input sampling frequency, the calculation can be decreased if the polyphase filter is used. Thus the calculation rate does not exceed the input and output conversion rate regardless of the conversion rate.

The dither adding and noise shaping unit 1B is described in detail with reference to FIGS. 18 to 29.

When re-quantization involves conversion to shorter word length, or the word length is elongated as a result of calculation, signals, low level signals in particular, often have deficiencies and harmonic distortions. A dither adder, or combination of dither adder and a noise shaper is provided to compensate the deficiencies.

A digital dither adder is described hereinafter. A threshold is usually fixed in quantization so that a change in information smaller than a quantization step may be lost in the course of quantization. However, if a noise is added to the input signal so as to exceed the threshold, the same effect as changing the threshold is obtained. Hence even a small change is maintained after the quantization. As a result, the non-linear transmission characteristics of a quantizing unit which causes the input signals to be stepwisely changed dependent on the height of the quantization step can be linearized. Accordingly, a harmonic distortion which occurs due to a non-linear transmission characteristic when a low level signal is input, can be removed or restrained. Such an added noise is called a dither.

Figure 18:
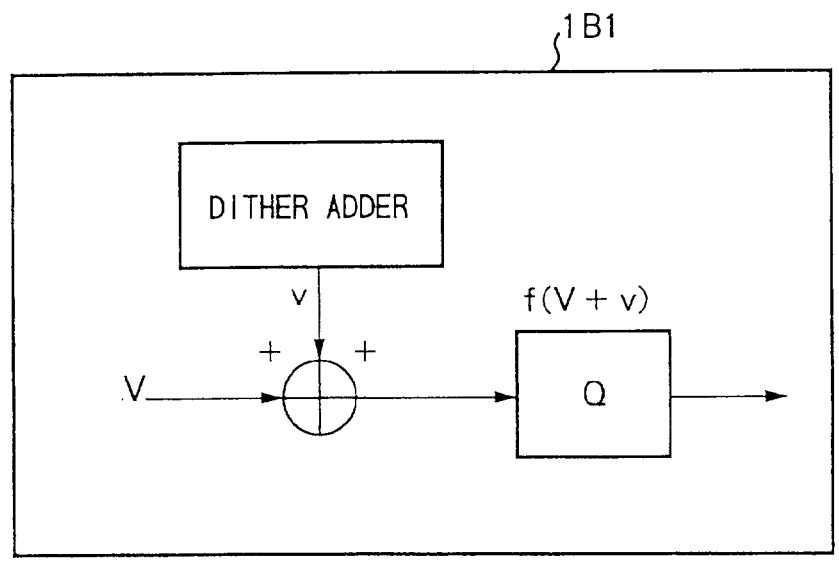
FIG. 18 is a schematic block diagram of a dither adder provided in a dither adding and noise shaping unit of FIG. 1.
Figure 19A:
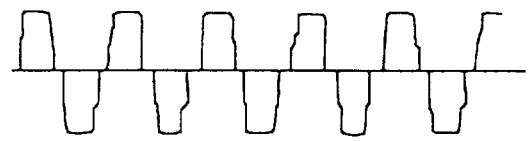
FIGS. 19a to 19d are graphs of a quantized signal and quantized signals added with various dithers.
Figure 19B:
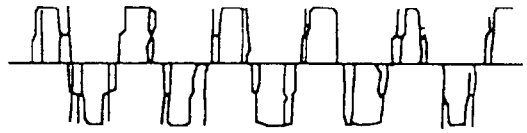
Figure 19C:
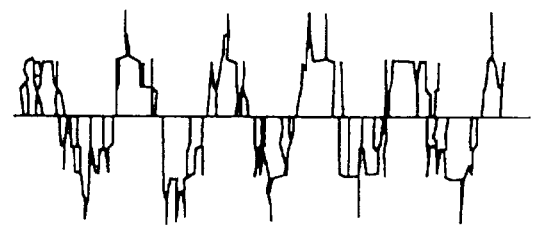
Figure 19D:
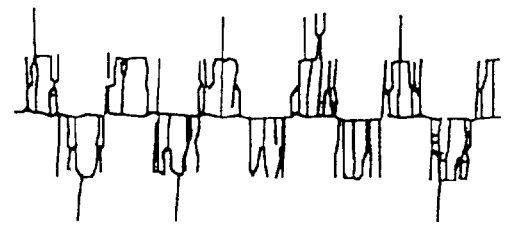

FIG. 18 shows a block diagram of a dither adder 1B1 provided in the dither adding and noise shaping unit 1B of the sampling frequency converting unit 1 of FIG. 1.

It is advisable that an average $\bar{f}(V)$ of the output signal after the dither is added at the dither adder 1B1 satisfies the equations, $$\bar{f}(V)=V,\ v_n(V)=C$$

where $v_n(V)$ is an output noise caused by adding the dither and C is a constant.

Although it is desirable to remove the dither at reproduction of the signals, it is generally difficult, and is a matter the trade-off between the removal of the dither and rising of the noise level. Actually, the dynamic range is increased when the dither is added, and the elevation of the noise level can be restrained or prevented when the noise shaper is also provided.

One of the digital dither adder is a rectancular-pdf (probability density function) dither adder wherein random numbers which are constant in a predetermined range are used as a dither. Since an offset is generated when the dither has only a positive value, a bipolar dither having peaks of ±1/2 LSB are preferably used.

If the number of bits of the dither is small, the randomness of the dither is deteriorated so that the quantization noise does not become a white noise. The linearity is enhanced as the number of bits increases.

A quantizing unit provided in the dither adder 1B1 is a mid-tread quantizing unit. The mid-tread quantizing unit adds the value 0.5 and thereafter, values at locations under 0.1 are omitted. If the number of the bits of the dither is sufficiently large, $$\bar{f}(v)=V,$$

is established, thereby linearizing the transmission characteristic of the quantization unit.

When a height of the quantization step is designated h, a pdf p(v) of a noise v which is constant when ±h/2, $$p(v) = \begin{cases} \dfrac{1}{h}, & -\dfrac{h}{2} \le v \le \dfrac{h}{2} \\ 0, & \text{others} \end{cases}$$

A rectangular dither Dr(n) is expressed as

Dr(n)=v(n)

When the noise is uniformly distributed, the pdf Pr(x) thereof is expressed as, $$Pr(x) = \frac{1}{h}$$

An average power Npr is expressed as.

$$Npr = \int_{-h/2}^{+h/2} Pr(x) \cdot x^2 dx$$
$$= \frac{h^2}{12}$$

Hence the average power Npr is added to an average power Nq of the quantization noise to obtain an average power Nrd of the noise as follows.

$$Nrd = Nq + Npr$$
$$= \frac{h^2}{12} + \frac{h^2}{12}$$
$$= \frac{h^2}{6}$$

Thus, compared to the case where only the average power Nq of quantization noise is applied, the signal-to-noise ratio is deteriorated as follows.

10 log 12−10 log 6≈3.0](dB)

Another type of dither adder is called a triangular-pdf (flat) dither adder. The above described dither having the peaks ±1/2 LSB renders it possible to linearize the transmission characteristic of the quantizing unit. However, at the peaks, there is generated a correlation between the noise and the input signal, so that there occurs a noise modulation wherein power of the noise fluctuates depending on the input signal.

The noise modulation can be prevented if the peak level of the dither is increased. However, neither the noise modulation nor the quantization noise can be restrained only by simply increasing the noise level. Only when two non-correlated noises are added to increase the level of the dither, the noise modulation can be restrained. Moreover, addition of three or more noises will not improve the noise modulation without increasing the noise level.

Figure 20A:
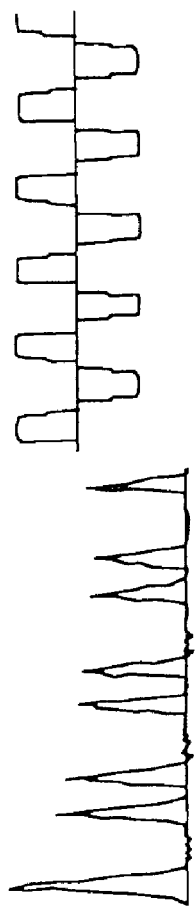
FIGS. 20a to 20d are graphs showing pdfs, spectrums and waveforms of the signals shown in FIGS. 19a to 19d, respectively.
Figure 20B:
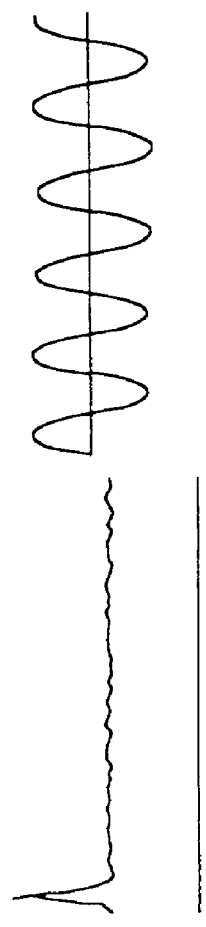
Figure 20C:
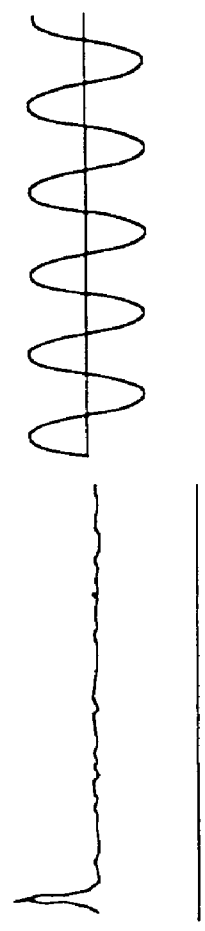

In accordance with a rough approximation of the Gaussian distribution, due to the central limiting theorem, the pdf of the two noises forms a triangle as shown in FIG. 20c. Hence such a dither adder is called a triangular (T)-pdf dither adder.

When the two non-correlative noises each having peaks of ±1/2 LSB are added as the dither, the average $\bar{f}(V)$ of the output signal is expressed as $$\bar{f}(V) = V \cdot v_n(V) = \frac{h}{2}$$

where h is the height of the quantizing step. Thus the transmission characteristic of the quantizing unit is linearized. At the same time, the noise modulation is prevented.

A T-pdf dither Dt(n), which is constant at ±h/2, is $$Dt(n)=v1(n)+v2(n)$$

where v1 and v2 are noises non-correlated to each other, respectively.

The T-pdf dither corresponds to a sum of two rectangular dithers. Hence, an average power Ntd of the noise of the T-pdf dither is $$Ntd = Nq + 2 * Npr$$
$$= \frac{h^2}{4}$$

Since 10 log 12−10 log 4≈4.77(dB)

the signal-to-noise ratio is deteriorated. Accordingly, the signal-to-noise ratio is further deteriorated by 1.76 dB then when the rectangular-pdf dither is applied, the signal-to-noise ratio of which case is 3.01 dB. However, since the noise modulation can be prevented, an optimum dither characteristic is obtained.

Another type of dither adder is a high-pass T-pdf dither which is a modification of the T-pdf dither adder. The high-pass T-pdf adder uses, instead of two different random numbers, a random number and another random number used at the last process, thereby imparting a high-pass correlation. Namely, a high-pass dither having the same characteristic as the T-pdf dither, and power spectrum deviated toward the higher frequencies is obtained. Hence the noise level of the the auditory sensation can be decreased without using a discrete noise shaper.

A T-pdf high-pass dither Dh(n) is expressed as, $$Dh(n)=v(n)-v(n-1)$$

Although the average of the noise level is the same as that of the T-pdf dither, since the power spectrum of the noise is deviated toward the high frequencies, the dynamic range of the auditory sensation becomes wider than when T-pdf dither is used.

FIG. 19a to 19d show waveforms of a sine wave, the amplitude of which is ±16-bit LSB, after the mid-tread quantization, after adding the R-pdf dither, T-pdf dither, and the T-pdf high-pass dither and quantized, respectively. The waveforms in FIGS. 19b to 19d seem to indicate that the addition of dithers only causes more noises.

Figure 20D:
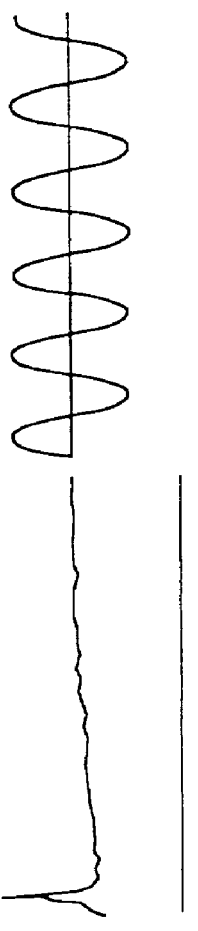

FIGS. 20a to 20d show pdfs, spectrums and waveforms corresponding to FIGS. 19a to 19d, respectively, of each time average of 128 sampled data. An average waveform of a low level signal which normally forms rectangular waves as shown in FIG. 20a are converted into neat sine waves as shown in FIGS. 20b to 20d. Namely, by adding the dither, the difference signal between the quantized signal and the original sine wave becomes a white noise. Hence the the white noise component and the signal component before the quantization can be clearly discerned.

Figure 21:
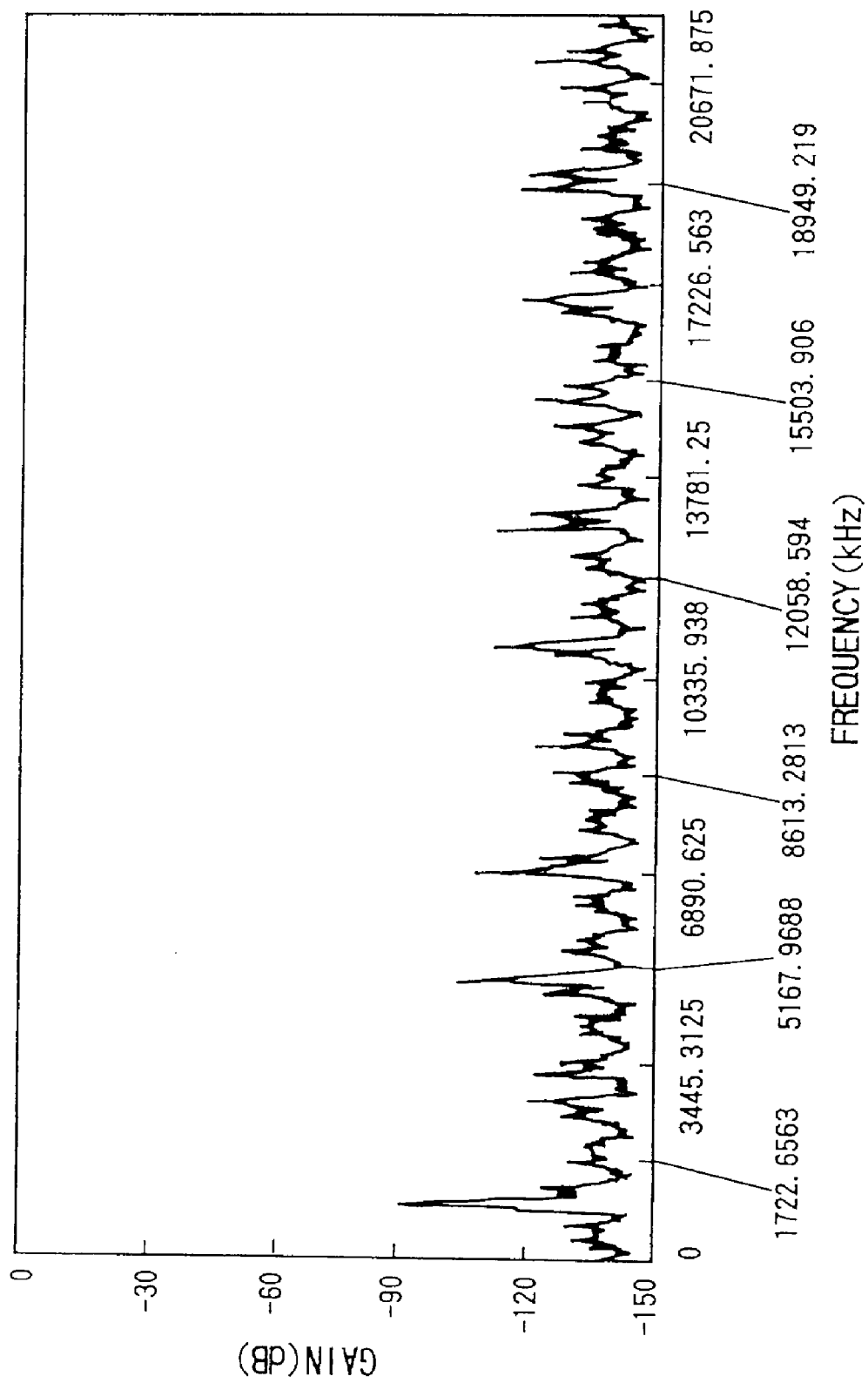
FIG. 21 is a graph showing a sine wave spectrum of a signal reproduced from a CD having an amplitude of ±16-bit LSB.
Figure 22:
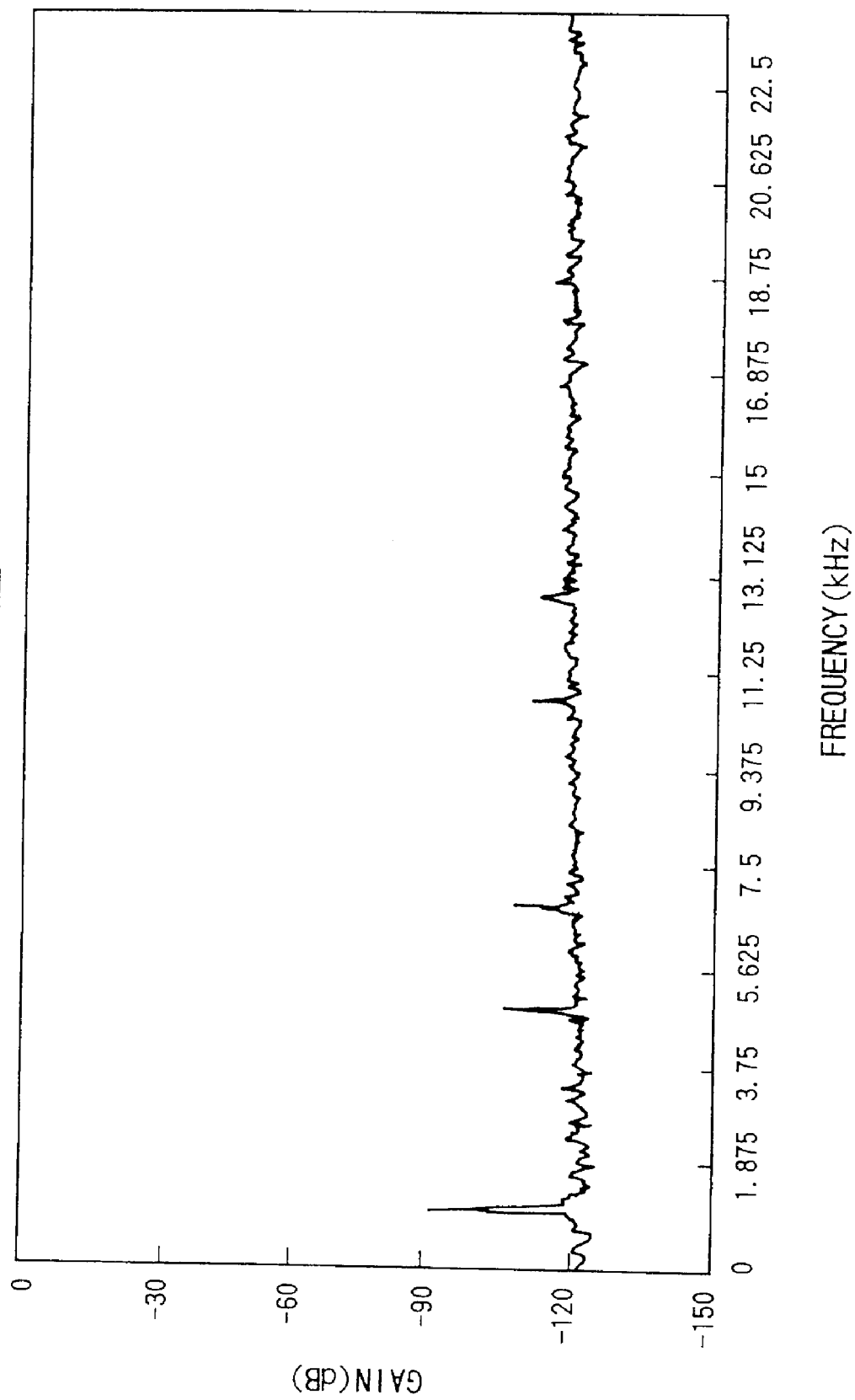
FIG. 22 is a graph showing a spectrum of the signal of FIG. 21 after a T-pdf dither is added.

More particularly, referring to FIG. 21 showing a spectrum of a since wave having an amplitude of ±16-bit LSB and a frequency of 997 Hz, reproduced from a CD, the waveform is rectangular so that a large quantity of harmonics is generated. On the other hand, when the T-pdf high-pass dither is added, the harmonic distortion becomes a white noise so that the distortions in auditory sensation can be largely restrained as shown in FIG. 22.

Figure 23:
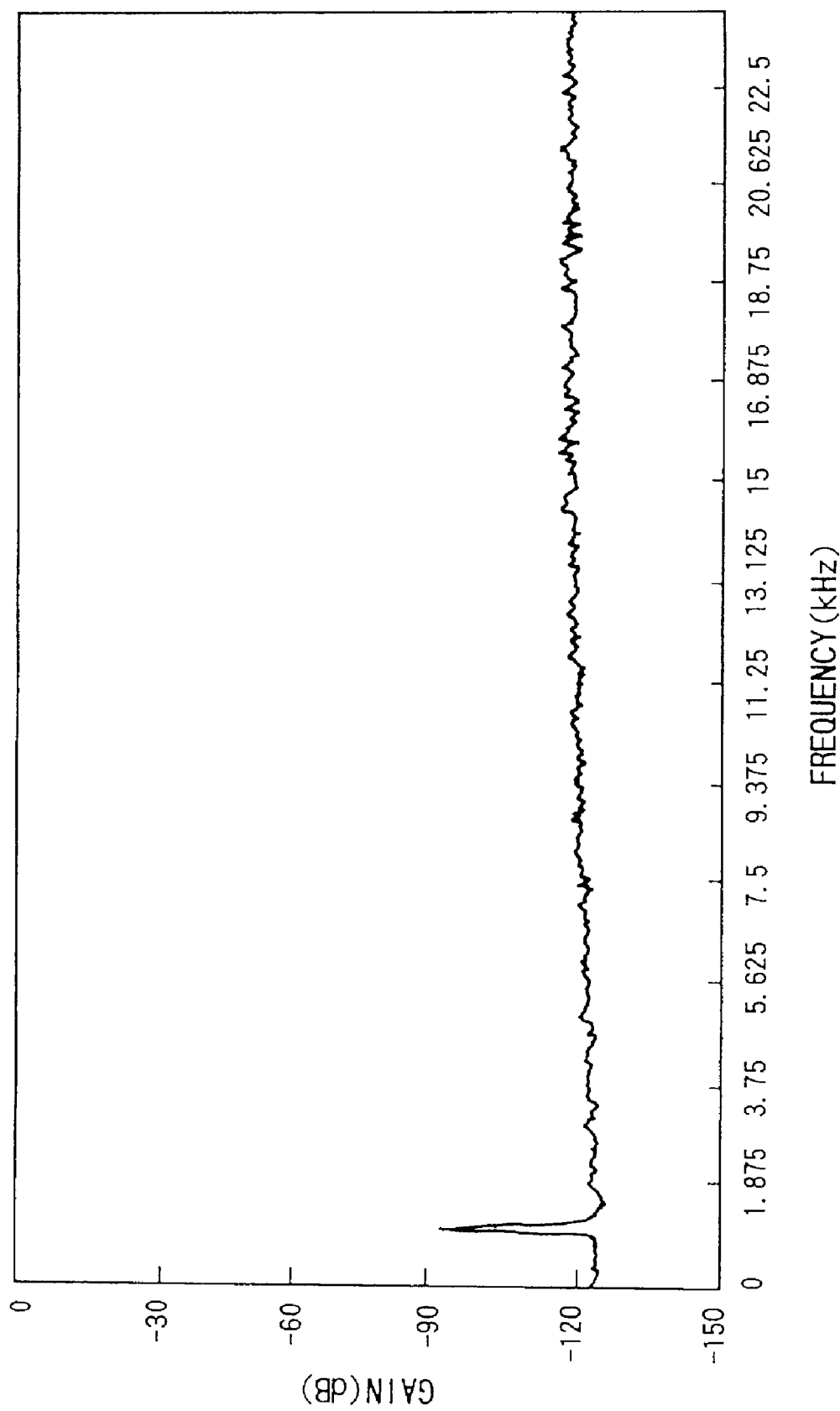
FIG. 23 is a graph showing a spectrum of a 24-bit input signal after the T-pdf dither is added.

Referring to FIG. 23, when the same signal as that shown in FIG. 21 is input at 24 bits, the harmonic distortion can also be restrained even after the signal is rounded to 16 bits.

It can be understood that the non-linear distortion generated at the quantizing unit is turned into a white noise when the dither is added. Namely, the stepwise non-linear characteristic of the output signal of the quantizing unit is accordingly linearized. Although the spectrums shown in FIGS. 21 to 24 are that of signals when the sampling frequency is converted from 44.1 kHz to 48 kHz, the same can be said when conversions between other sampling frequencies are executed including the conversion at the rate of 1/1.

Figure 24:
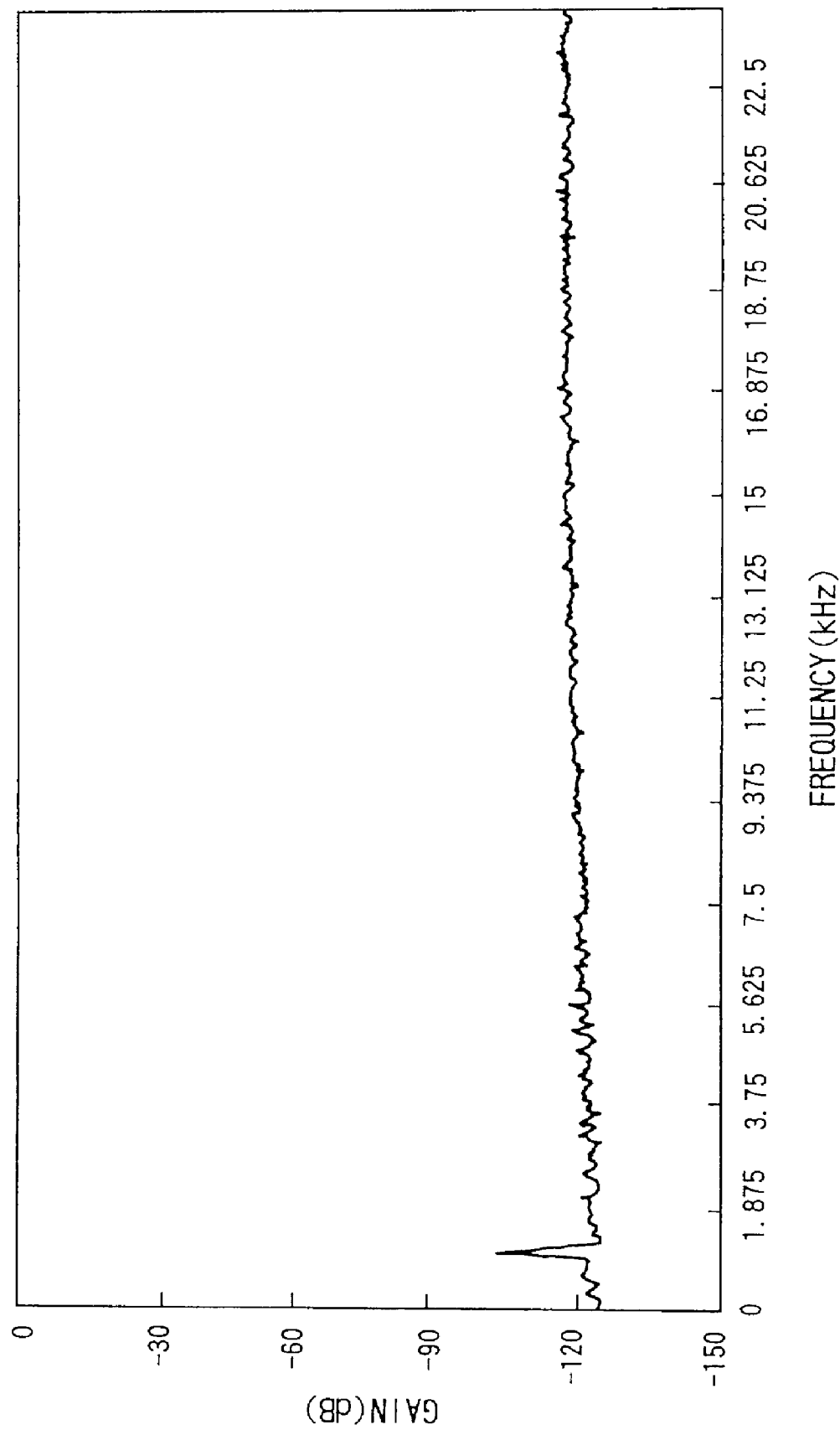
FIG. 24 is a graph showing a spectrum of a 16-bit output signal generated from an 18-bit input signal after the T-pdf dither is added.

When a signal having an amplitude of ±18-bit LSB, which cannot be represented by a 16-bit expression, is input, the output signal thereof inevitably becomes nil. However, when the dither is added, the 18-bit LSB signal can be expressed with 16 bits as shown in FIG. 24.

Figure 25:
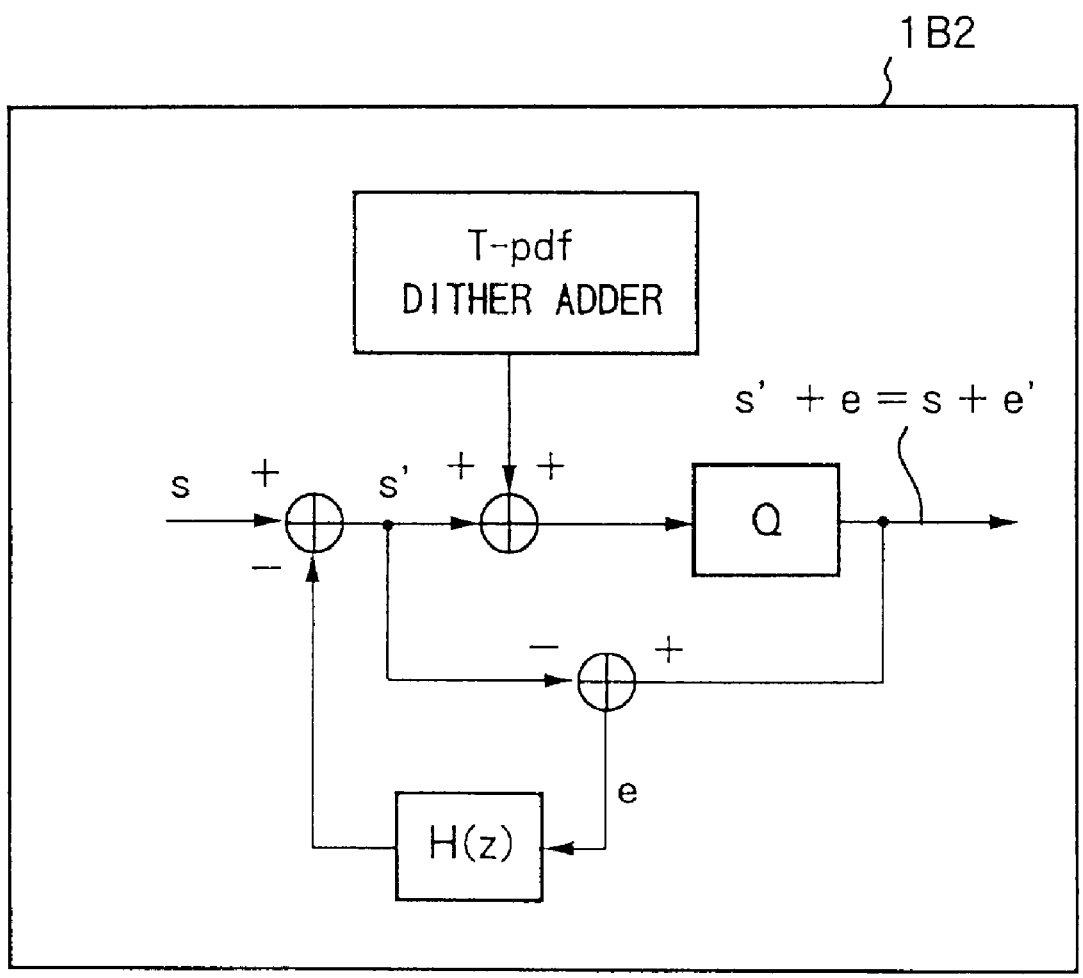
FIG. 25 is a schematic block diagram of a dither adder.

A noise shaper 1B2 which is schematically shown in FIG. 25 is further provided in the dither adder and noise shaping unit 1B of FIG. 1. In the noise shaper 1B2, a noise generated at quantization is fed back so as to decrease the noise level of the auditory sensation.

More particularly, the frequency response of the noise is preferably controlled so that the power in a certain frequency range, wherein noise in the auditory sensation is easily detected, is restrained, and the power in another frequency range, wherein noise is less easily heard, is increased. Hence the dynamic range of the auditory sensation can be widened, thereby restraining the level of the noise increased by the dither.

In addition, in the noise shaper only the quantized noise is fed back and the input signal proper is not effected. Thus it is important that, in order to shape the frequency response of the noise as desired, the noise is converted beforehand into a white noise by adding the dither. The harmonic distortion of extremely low level signals cannot be prevented only by noise shaping. On the contrary, the shaping of the signals including the harmonic distortion only causes more annoyance.

As shown in FIG. 25, the output signal of the noise shaper 1B2 is expressed as, $$s'+e=s+e'$$

where s in an input signal, s' a feedback input signal, e a quantized noise, and e' a quantized noise after noise-shaping. Hence in a region z, the feedback input signal s' can be expressed in the following two ways.

$$s'(z)=s(z)+e'(z)-e(z)$$

$$s'(z)=s(z)-H(z)e(z)$$

Hence, $$e'(z)=[1-H(z)]e(z)$$

When $$z=e^{jwT},$$

where T is a sampling interval, the frequency response of H(z) is H($e^{jwT}$). Hence, if the quantized noise e is a white noise, the frequency response thereof is weighted by |1−H($e^{jwT}$)|.

In order to maintain the channel capacity, a noise shaping filter comprising the noise shaper 1B2 must be designed in accordance with the following conditions depending on the information theory.

(1) 1−H($e^{jwT}$) must be in the minimum phase.

(2) The average of the logarithmic power spectral density (PSD) of 1−H(z) must be zero.

Thus the designing procedure is as follows.

(1) The desired shaping characteristic is normalized so that the average logarithmic PSD is zero. The frequency response of the minimum phase in actual practice is,

|1−H($e^{jwT}$)|$^2$ (2) In order to determine 1−H($e^{jwT}$), the phase is so determined to render it the minimum phase.

The amplitude and the phase are actually in Hilbert's relationship at the minimum phase. Hence, when the phase characteristic is determined in accordance with the Hilbert conversion in dependency on the amplitude characteristic. Accordingly, 1−H($e^{jwT}$) is invariably determined.

(3) 1−H($e^{jwT}$) is converted by IFFT (Inverse Fast Fourier Transformation) and an impulse response h(n) of the noise shaper is obtained.

(4) When a number M of the taps of the noise shaper filter is smaller than a number N of the points of the IFFT, h(0) to h(M) are sliced from the coefficient using such means as a half Hanning window.

Thus 1−H(z) is determined as $$1-H(z)=h(0)+h(1)z^{-1}+h(2)z^{-2}+\ldots h(M)z^{-M}$$

If the procedures (1) and (2) are accurately executed, h(0) becomes 1.0.

(5) The impulse response H(z) of the noise shaping filter is calculated in accordance with the equation in the procedure (4) as follows.

$$H(z)=z^{-1}[-h(1)-h(2)z^{-1}-\ldots -h(M)z^{-(M-1)}]$$

Hence the tap coefficients −h(1), −h(2) . . . −h(M) are determined.

Accordingly, by using the dither adder and the noise shaper together, even an extremely low level signal far lower than 1 LSB can be reproduced. Namely, if the dither adder and the noise shaper are used, the bits of a precise signal can be compressed so that even the signal which cannot be normally represented except with 20 or more bits is reproduced from a CD, which uses 16 bits.

Figure 26:
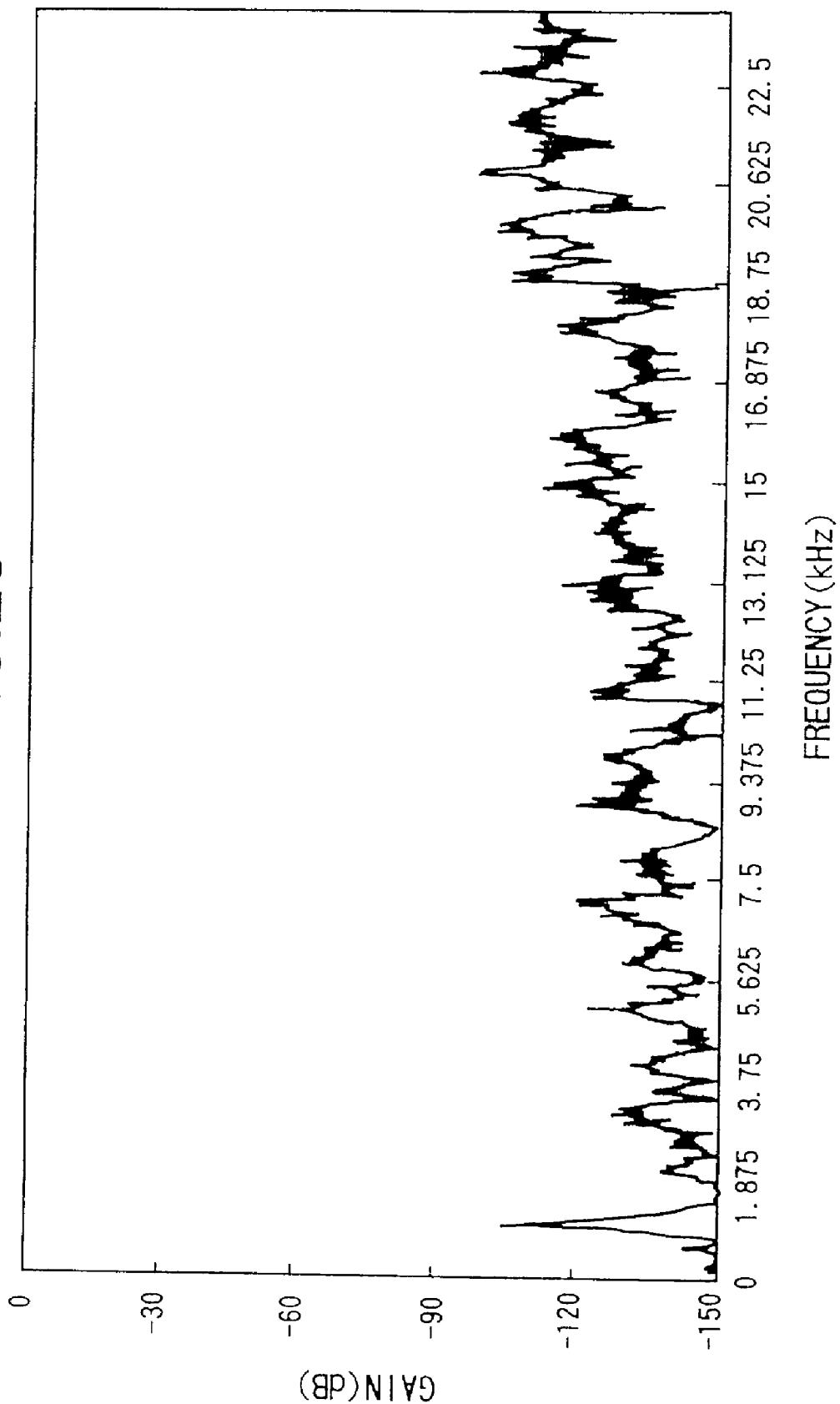
FIG. 26 is a graph showing a spectrum of an 18-bit input signal.
Figure 27:
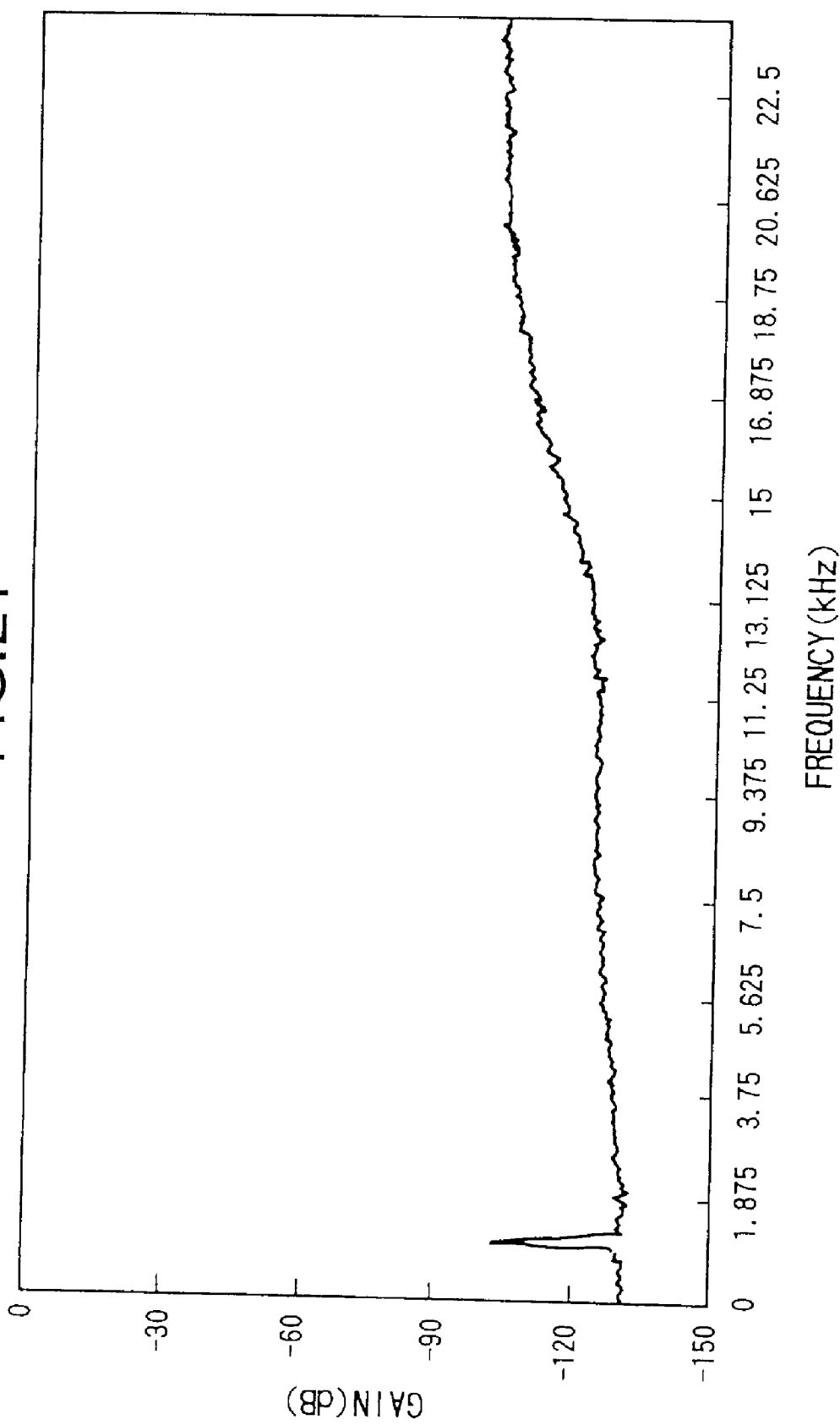
FIG. 27 is a graph showing a spectrum of an 18-bit input signal after a dither is added.

FIG. 26 shows a spectrum of a sine wave signal of 997 Hz having a peak of 18-bit LSB wherein the signal is rounded into 16 bits using only the noise shaper. FIG. 27 shows a spectrum of the same signal wherein the T-pdf dither is added in a noise shaper loop. As shown in FIGS. 26 and 27, when the dither is not added, there is generated a harmonic noise at a level higher than the signal. When the dither is added, no such harmonic noise occurs.

Figure 28:
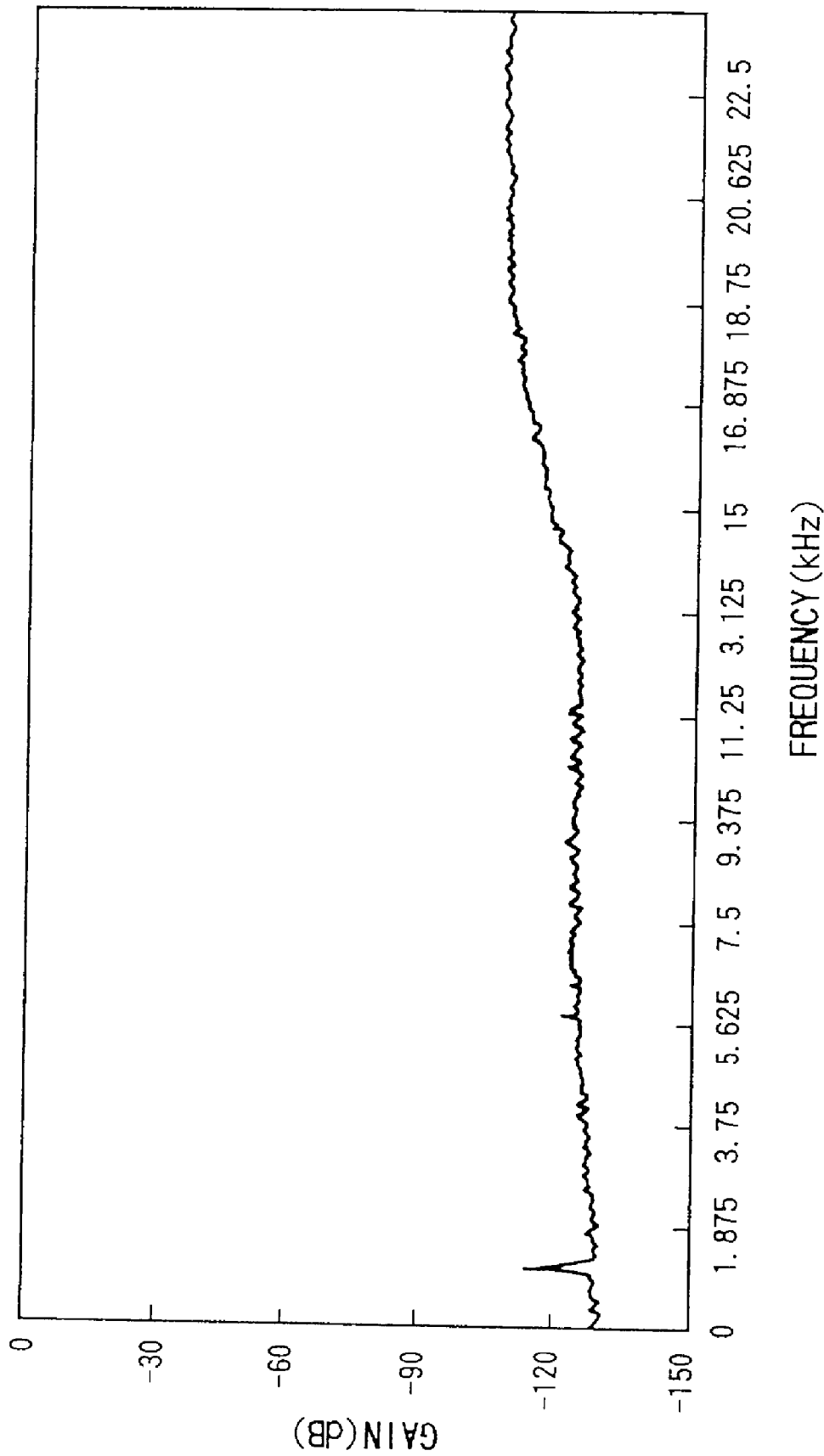
FIG. 28 is a graph showing a spectrum of a 20-bit input signal after a dither is added.

Referring to FIG. 28, a 20-bit LSB signal can be reproduced with 16 bits. In accordance with the characteristic of the present noise shaper, no response is obtained when the 20-bit LSB signal is input without adding the dither. Namely, with only the noise shaper, only the precision of 17 to 18 bits is obtained. On the contrary, when the dither is added, the precession of 19 to 20 bits is achieved.

Figure 29:
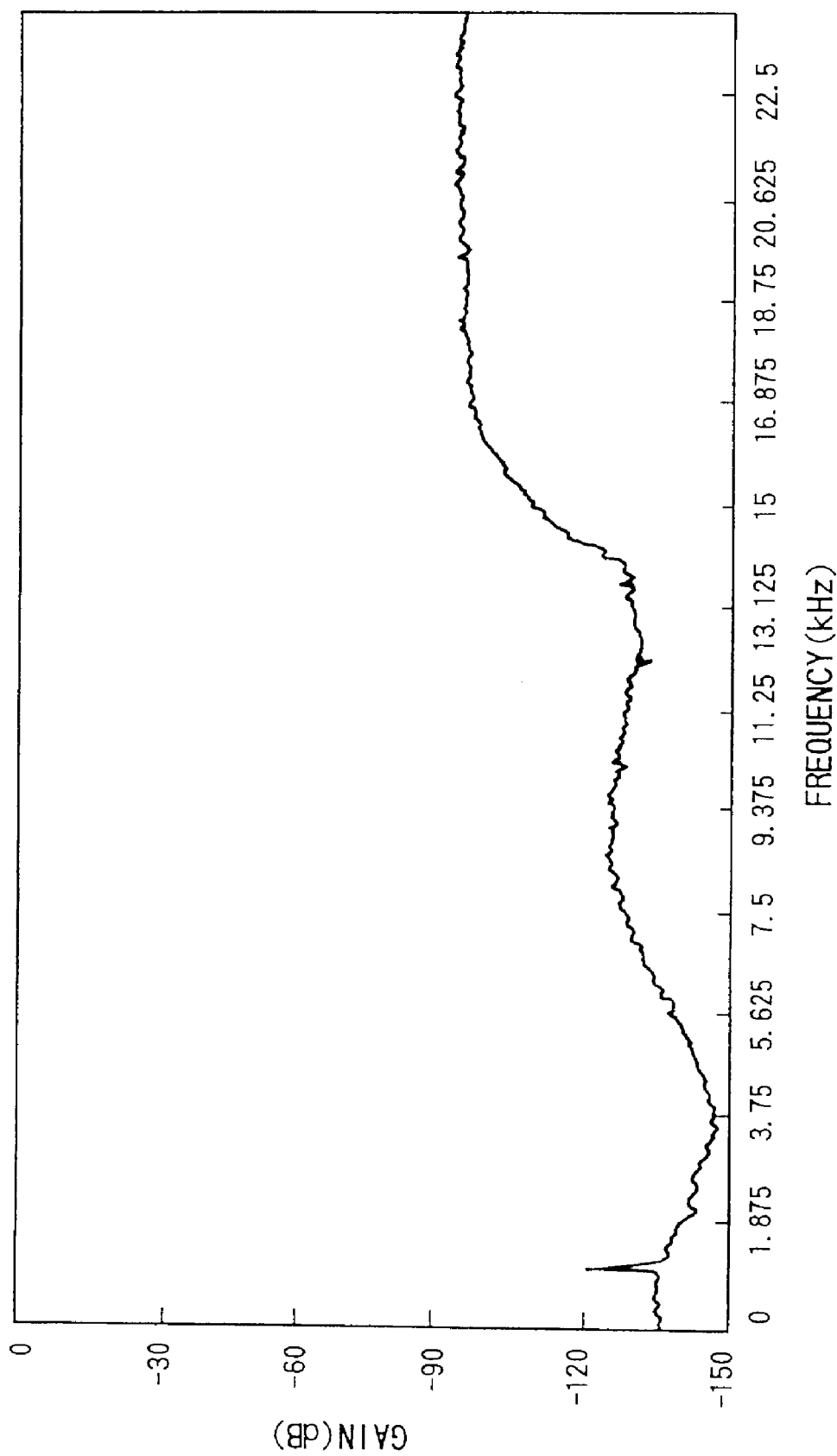
FIG. 29 is a graph showing a spectrum of a 21-bit input signal after a dither is added.

In a spectrum shown in FIG. 29, a shaping filter having a characteristic similar to the curve of lower limit of hearing area is used. a 21-bit LSB signal in a range up to 14 kHz can be reproduced. Thus, by controlling the characteristic of the noise shaping filter, the precision of more than 20 bits of the auditory sensation can substantially completely be achieved with a 16-bit signal.

Figure 30:
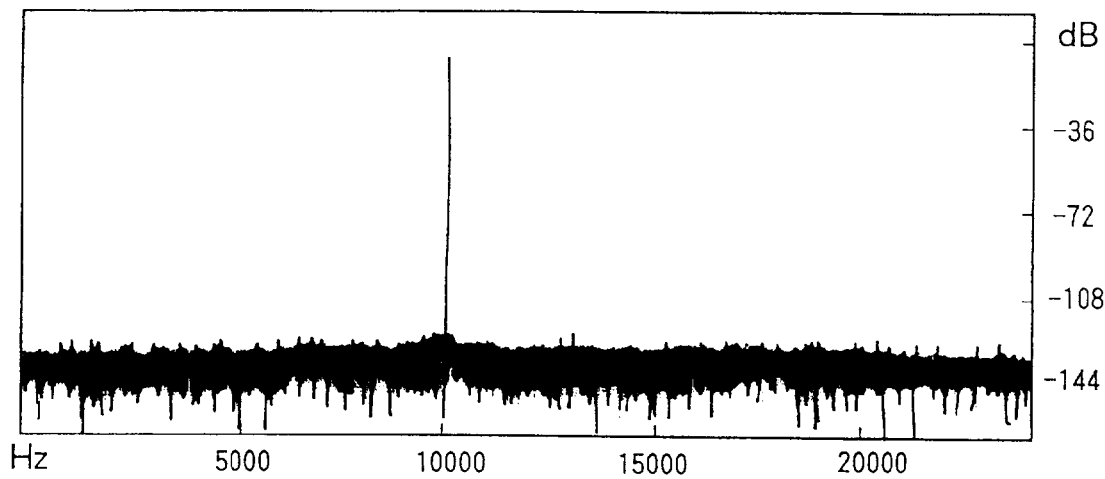
FIG. 30 is a graph showing an output signal of the conversion system of the present invention.
Figure 31:
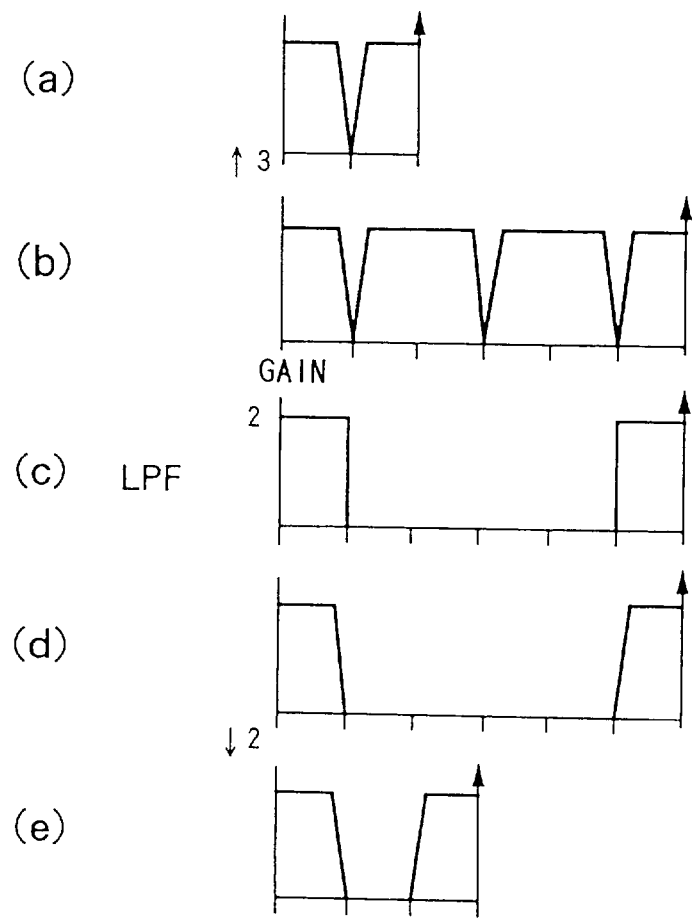
FIGS. 31a through 31e show graphs explaining a procedure for converting a sampling frequency at a rate of 3/2 in a conventional conversion system.
Figure 35A:
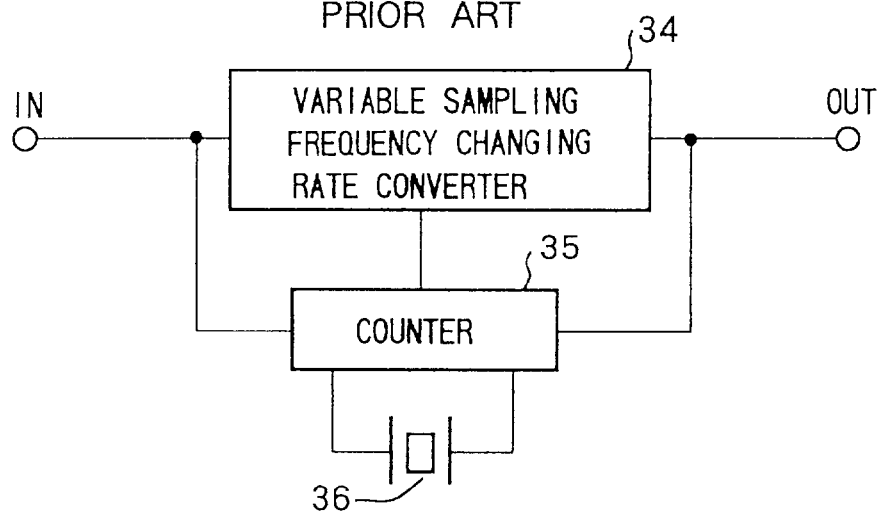
FIG. 35a is a block diagram of a conventional conversion system using an asynchronous indirect conversion method.
Figure 35B:
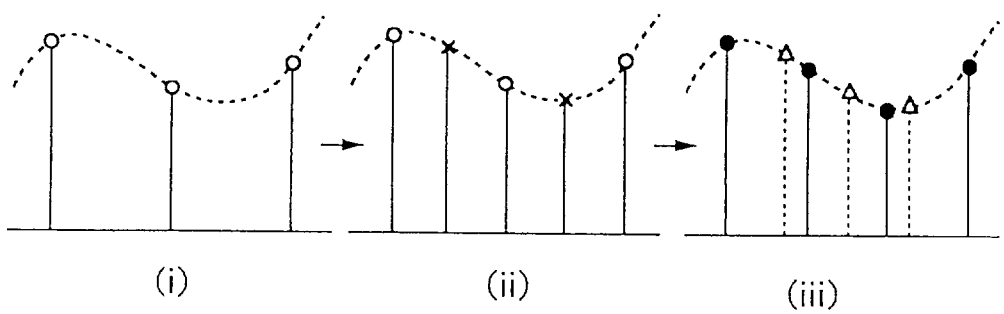
FIG. 35b are graphs explaining the operation of the asynchronous indirect conversion method.
Figure 36:
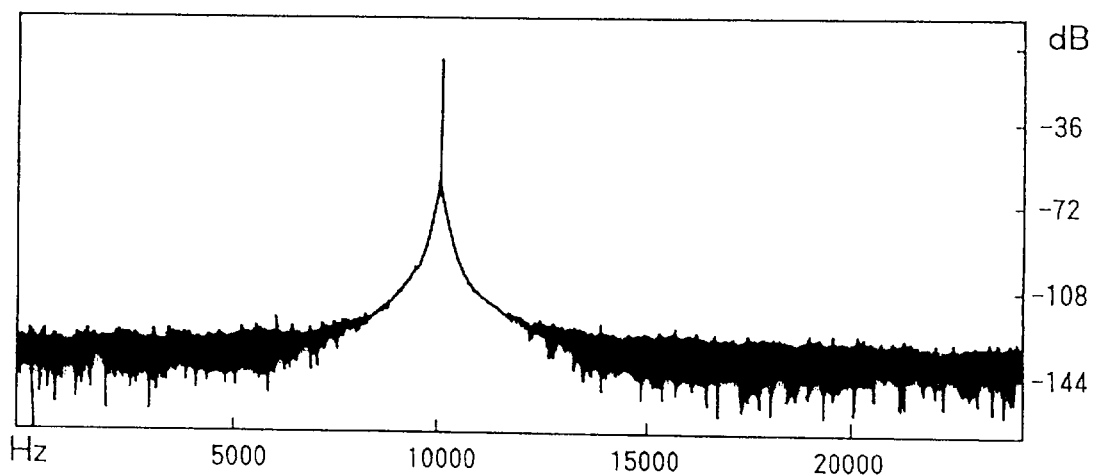
FIG. 36 is a graph showing an output signal of the conventional asynchronous indirect conversion system.

In accordance with the present invention, the sampling frequency is directly converted in accordance with the conversion rate between the input sampling frequency and output sampling frequency. Thus as shown in FIG. 30, showing a spectrum when a signal of 10.007 kHz is input, an extremely accurate conversion is performed without being affected by time jitters of the clock of the input signal and absolute deviation which occurs in a conventional system as shown in FIG. 36.

When the multiple stage filter and a polyphase filter is used at the conversion, the calculating amount and the capacity of the memory can be decreased, thereby enabling to realize a real-time,highly precise conversion using hardware.

The ripple in the conversion filter section is restrained so as to be under −155 dB. Accordingly, even a signal representing a 24-bit data sampled at a frequency of 96 kHz, can be converted without fail.

Moreover, the overall characteristic of the filter is provided with a sharp cut-off profile, noise due to aliasing error is prevented. In addition, output of the sampling frequency conversion unit is fed to the dither adding and noise shaping unit so that the sound quality is not deteriorated by the conversion, and a precise signal is obtained even when a 16-bit signal is output.

While the invention has been described in conjunction with preferred specific embodiment thereof, it will be understood that this description is intended to illustrate and not limit the scope of the invention, which is defined by the following claims.

What is claimed is:

1. A sampling frequency converting system wherein an input signal having a first sampling frequency which is one of frequencies of 96 (kHz), 88.2 (kHz), 48 (kHz), and 44.1 (kHz) is converted to an output signal having a second sampling frequency which is one of frequencies of 96 (kHz), 88.2 (kHz), 48 (kHz), 44.1 (kHz), and 32 (kHz), the system comprising:

over-sampling means for passing the input signal based on the first sampling frequency and for outputting as a sampling signal, or for double over-sampling the input signal and for outputting as a sampling signal;

conversion filtering means having a prototype filter for filtering the sampling signal at one of conversion rates of 147/160, 160/147, and 1/1, based on the first sampling frequency and the second sampling frequency, and for outputting as a filtering signal;

low pass filter means having a predetermined cutoff frequency band for passing a low frequency range of the filtering signal for outputting a low frequency signal; and down-sampling means for passing the low frequency signal based on the first sampling frequency and the second sampling frequency for outputting as the output signal, or for down-sampling the low frequency signal by one half or one third for outputting as the output signal.

2. The system according to claim 1 wherein the conversion filtering means forms a plurality of sub-filters in accordance with a plurality of filter coefficients of the prototype filter corresponding to a plurality of phases, polyphase filter means is formed by changing over the sub-filters, the filtering signal is directly produced from the sampling signal by the polyphase filter means.

3. The system according to claim 1 wherein the conversion filtering means has a prototype filter having a band width smaller than a transition band width corresponding to the conversion from the input signal having the sampling frequency of 48 (kHz) to the output signal having the sampling frequency of 88.2 (kHz).

4. The system according to claim 1 wherein the conversion filtering means is formed into a multi-stage composition comprised of a plurality of sub-conversion filter means connected in multi-stages.

5. The system according to claim 4 wherein the conversion filtering means has first sub-conversion filter means for performing 1/49 down-sampling, and second sub-conversion filtering means for performing 1/3 down-sampling.

6. The system according to claim 5 further comprising noise shaping means for performing noise shaping of the dither added output signal and for outputting a dither noise shaping output signal.

7. The system according to claim 1 further comprising dither adding means for adding digital dither to the output signal for outputting as a dither added output signal.

8. The system according to claim 2 wherein a tap coefficient of the conversion filtering means is determined such that a gain error produced between the phases becomes a smaller value than a standard error.

9. The system according to claim 7 wherein the digital dither is rectangular dither.

10. The system according to claim 7 wherein the digital dither is flat dither.

11. The system according to claim 7 wherein the digital dither is high pass dither.

12. A sampling frequency converting method wherein an input signal having a first sampling frequency which is one of frequencies of 96 (kHz), 88.2 (kHz), 48 (kHz), and 44.1 (kHz) is converted to an output signal having a second sampling frequency which is one of frequencies of 96 (kHz), 88.2 (kHz), 48 (kHz), 44.1 (kHz), and 32 (kHz), the steps comprising:

passing the input signal based on the first sampling frequency and outputting as a sampling signal, or double over-sampling the input signal and outputting as a sampling signal;

filtering the sampling signal at one of conversion rates of 147/160, 160/147, and 1/1 by using a prototype filter, based on the first sampling frequency and the second sampling frequency, and outputting as a filtering signal;

passing a low frequency range of the filtering signal and outputting a low frequency signal; and passing the low frequency signal based on the first sampling frequency and the second sampling frequency, and outputting as the output signal, or down-sampling the low frequency signal by one half or one third, and outputting as the output signal.

13. The method to claim 12 wherein the conversion filtering step comprises performing direct filtering of the sampling signal by polyphase filter means.

14. The system according to claim 12 wherein the conversion filtering step is composed by a multi-stage composition having a plurality of sub-conversion filters.

15. The system according to claim 14 wherein the conversion filtering step includes first sub-conversion filtering step performing 1/49 down-sampling, and second sub-conversion filtering step performing 1/3 down-sampling.

16. The system according to claim 12 further comprising adding digital dither to the output signal.

17. The system according to claim 16 further comprising performing noise shaping of the dither added output signal.

* * * * *